United States Patent
Arao et al.

(10) Patent No.: US 6,383,359 B2
(45) Date of Patent: May 7, 2002

(54) METHOD FOR FORMING A ZINC OXIDE LAYER AND METHOD FOR PRODUCING A PHOTOVOLTAIC DEVICE

(75) Inventors: Kozo Arao; Hideo Tamura, both of Nara; Noboru Toyama, Hirakata; Yuichi Sonoda, Nara; Yusuke Miyamoto, Kyotanabe, all of (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/824,041

(22) Filed: Apr. 3, 2001

Related U.S. Application Data

(62) Division of application No. 09/233,328, filed on Jan. 20, 1999, now Pat. No. 6,238,808.

(30) Foreign Application Priority Data

Jan. 23, 1998 (JP) ............................................. 10-025180
Jan. 23, 1998 (JP) ............................................. 10-025181

(51) Int. Cl.$^7$ .......................... C23C 28/00; C25D 11/02
(52) U.S. Cl. .................... 205/155; 204/192.1; 205/314; 205/333; 205/188; 205/305; 428/623; 428/629; 428/632; 428/633; 428/469; 428/935; 438/95; 438/104
(58) Field of Search .................. 428/623, 629, 428/632, 633, 469, 935; 205/188, 314, 333, 155, 305; 204/192.1; 438/95, 104

(56) References Cited

U.S. PATENT DOCUMENTS

| 5,804,466 | A | | 9/1998 | Arao et al. ..................... 438/95 |
| 6,123,824 | A | * | 9/2000 | Sano et al. .................. 205/333 |
| 6,238,808 | B1 | * | 5/2001 | Arao et al. .................. 428/629 |

FOREIGN PATENT DOCUMENTS

| EP | 0794270 A1 | * | 9/1997 | ............ C25D/9/08 |
| EP | 0 794 270 | * | 9/1997 | |

* cited by examiner

*Primary Examiner*—Robert R. Koehler
(74) *Attorney, Agent, or Firm*—Fitzpatrick, Cella, Harper & Scinto

(57) ABSTRACT

Provided are a substrate with a zinc oxide layer, in which at least a zinc oxide layer is provided on a support substrate, wherein the zinc oxide layer comprises a zinc oxide layer having the c axis perpendicular to the support substrate and a zinc oxide layer having the c axis slantindicular to the support substrate in the order from the side of the support substrate; and a photovoltaic device in which a semiconductor layer is formed on the substrate with the zinc oxide layer. Thus provided is the inexpensive photovoltaic device with excellent reflective performance and optical confinement effect and with high photoelectric conversion efficiency.

4 Claims, 12 Drawing Sheets

METHOD FOR FORMING A ZINC OXIDE LAYER AND METHOD FOR PRODUCING A PHOTOVOLTAIC DEVICE

This application is a division of application number 09/233,328, filed Jan. 20, 1999, now U.S. Pat. No. 6,238,808.

BACKGROUND OF THE INVENTION

1. Field of the Invention

The present invention relates to a substrate with a zinc oxide layer (hereinafter often referred to as a ZnO-layered substrate) used, for example, as a component of a photovoltaic device such as a solar cell or the like, a method for forming the zinc oxide layer, a photovoltaic device, and a method for producing the photovoltaic device and, more particularly, to a substrate provided with a zinc oxide layer as a part of a reflecting layer for improving the long-wavelength sensitivity of the solar cell and a method for forming it.

2. Related Background Art

The applicants already suggested a combination of a metal layer with a transparent conductive layer made by sputtering, which was used as a reflecting layer of the photovoltaic device (solar cell). In this suggestion, sputter conditions of the metal layer for suppressing decrease of reflectance of the metal layer are detailed in order to obtain the reflecting layer with good reflection characteristics. The sputtering method, however, requires time and labor for production of a target even if inexpensive materials are used. Thus, the cost of the target is not low and the efficiency of utilization thereof is as low as approximately 20%. The material cost is, therefore, very high. Moreover, a sputter apparatus is a vacuum device and the apparatus is thus expensive. As a result, the depreciation cost is also high. These factors hinder providing inexpensive solar cells to solve environmental issues. The applicants also suggested a method for depositing two kinds of zinc oxide layers on a long rolled substrate (hereinafter referred to as "long substrate") by electrolytic deposition (electrodeposition) being excellent in the optical confinement effect and industrially very inexpensive. This method at the present time, however, does not allow the zinc oxide layers to be deposited directly on an aluminum layer which is inexpensive and which has high reflectance. Grounds thereof are that the surface of aluminum is modified into boehmite by a hot acid solution, thereby extremely degrading the reflection and that the boehmitemodified surface is of crumple-like structure whereby growth of zinc oxide is also of the crumple shape.

An object of the present invention is, therefore, to inexpensively provide a ZnO-layered substrate excellent in reflection and the optical confinement effect and useful as a substrate with a reflecting layer for a solar cell, solving the above problems.

SUMMARY OF THE INVENTION

The present invention provides a ZnO-layered substrate in which at least a zinc oxide layer is provided on a support substrate, wherein the zinc oxide layer comprises a zinc oxide layer having the c axis perpendicular to the support substrate and a zinc oxide layer having the c axis slantindicular to the support substrate in the order from the side of the support substrate. The present invention also provides a method for forming a zinc oxide layer, comprising a step of forming on a substrate a zinc oxide layer having the c axis perpendicular to the substrate by a sputtering method, and a step of forming a zinc oxide layer having the c axis slantindicular to the substrate on the zinc oxide layer having the c axis perpendicular to the substate, by an electrodeposition method.

Further, the present invention provides a photovoltaic device comprising a ZnO-layered substrate in which at least a zinc oxide layer is provided on a support substrate, and a semiconductor layer, wherein the zinc oxide layer comprises a zinc oxide layer having the c axis perpendicular to the support substrate and a zinc oxide layer having the c axis slantindicular to the support substrate in the order from the side of the support substrate.

In addition, the present invention provides a method for producing a photovoltaic device, comprising a step of producing a ZnO-layered substrate by forming on a support substrate a zinc oxide layer having the c axis perpendicular to the support substrate by a sputtering method and forming a zinc oxide layer having the c axis slantindicular to the support substrate on the zinc oxide layer having the c axis perpendicular to the support substrate, by an electrodeposition method, and a step of forming a semiconductor layer on the ZnO-layered substrate.

In the present invention, the substrate (support substrate) is preferably an electrically conductive substrate. The support substrate is preferably an SUS sheet and the SUS sheet preferably has a 2D-surface. It is also preferable to use an SUS substrate of a long roll form.

In the ZnO-layered substrate and the photovoltaic device of the present invention, a metal layer is preferably interposed between the support substrate and the zinc oxide layer. The thickness of the metal layer is preferably 1000 Å to 2500 Å. The metal layer is preferably a metal aluminum layer. A temperature of the substrate in forming the metal aluminum layer by sputtering is preferably set at 100° C. or less. It is preferable to interpose an aluminum oxide layer between the metal aluminum layer and the zinc oxide layer. The aluminum oxide layer is preferably one formed by oxidizing the metal aluminum layer by an oxygen plasma process. On that occasion, the power of the oxygen plasma in the oxygen plasma process is preferably so set that a total reflectance of light incident from the side of the zinc oxide layer having the c axis slantindicular to the substrate is not less than 60% and that electric resistance in a direction normal to the surface of the substrate is not more than 20 $\Omega/cm^2$.

Further, an average of inclination angles of crystal grains of a surface of the zinc oxide layer having the c axis slantindicular to the support substrate on an opposite side to the support substrate is preferably not less than 15°; surface roughness Ra of the opposite surface of the layer to the support substrate is preferably not more than 80 nm; the thickness of the layer is preferably not less than 5000 Å. The zinc oxide layer having the c axis slantindicular to the substrate is preferably formed by electrodeposition using a zinc nitrate solution having a concentration of not less than 0.15 mol/l.

The thickness of the zinc oxide layer having the c axis perpendicular to the substrate is preferably 1500 Å to 2500 Å. The temperature of the substrate in forming the layer by sputtering is preferably set at 380° C. or less. The temperature of the substrate in forming the zinc oxide layer having the c axis perpendicular to the substrate is preferably so set that an average grain size of crystal grains observed in the surface of the zinc oxide layer having the c axis slantindicular to the substrate on the opposite side to the substrate is not more than 2 $\mu$m and that a scattering reflectance of light incident from the side of the zinc oxide layer having the c axis slantindicular to the substrate is not less than 20% at 800 nm. The temperature of the substrate in forming the zinc oxide layer having the c axis perpendicular to the substrate is preferably so set that surface roughness Ra of the surface of the zinc oxide layer having the c axis slantindicular to the substrate on the opposite side to the substrate is not more than 80 nm and that an average of inclination angles of crystal grains in the surface is not less than 15°.

Further, a total reflectance of light incident from the side of the zinc oxide layer into the ZnO-layered substrate of the present invention is preferably not less than 60% at 800 mn and a scattering reflectance is preferably not less than 20% at 800 nm.

DESCRIPTION OF THE PREFERRED EMBODIMENTS

The present invention is directed to effectively forming surface texture and depressions without decreasing the reflectance of the ZnO-layered substrate suitable for the reflecting layer for a solar cell, thereby increasing collected photocurrent. At the same time, the present invention is also directed to forming the reflecting layer industrially at low cost and on a stable basis. In the present invention, the reflecting layer is formed by stacking appropriate films, respectively using a vacuum device and a wet device. Specifically, an aluminum film and a zinc oxide layer having c axis perpendicular to the substrate are, made by sputtering capable of forming a dense film with excellent adhesion on any substrate, and a zinc oxide layer having the c axis slantindicular to the substrate is made by electrodeposition by which the surface texture can be controlled readily and by which the film can be made at low production cost.

In order to accomplish the object of the present invention, it is conceivable to employ a process for forming the thin aluminum film and zinc oxide layer by the sputtering method and for forming the thick zinc oxide layer thereon by the electrodeposition method. Conceptually, it is possible to determine cost distribution in proportion to the thickness. For example, if the thickness of the sputtered film is 10% or less of the total thickness, the cost impact due to the sputtering is 10% or less of the total cost; therefore, the actual cost cannot be more than two to three times the cost where the film is formed only by electrodeposition. This cost impact varies depending upon the instrument cost of the sputter device and electrodeposition device, the cost of the respective materials, fuel, light, labor, the operating rate and yield of each device, and so on. Basically, it is more preferable in terms of the cost to make the sputtered film as thin as possible.

It was, however, clarified by the inventors from studies on stacking of the sputtered film and electrodeposited film that different results were achieved depending upon conditions of the two films. This will be described based on the results of experiments conducted by the inventors.

Figure 4:
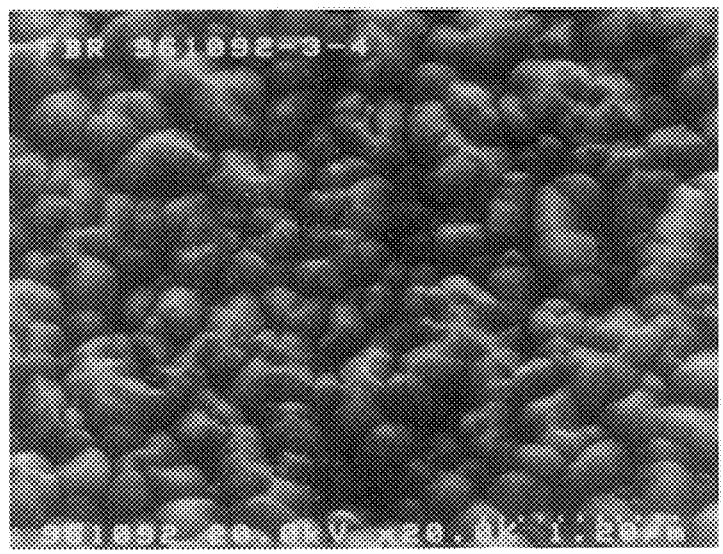
FIG. 4 is an SEM image of a surface of a zinc oxide layer having the c axis perpendicular to the substrate, made by sputtering.

FIG. 4 shows a typical example of a surface SEM (scanning electron microscope) image of a ZnO film formed by sputtering. The temperature of the substrate during sputtering of ZnO was 400° C. for forming texture in the surface and the film of ZnO was deposited in the thickness of about 2 μm. Since the sputtered film is dense and reflects the composition of a target, it has an advantage of capability of readily being adapted to change in doping and composition. In most cases, the structure thereof is of hexagonal polycrystals having the c axis perpendicular to the substrate.

The ZnO film illustrated in FIG. 4 has also c axis perpendicular to the substrate and grain sizes of its crystal grains are not more than several hundred Å which are much smaller than the size of the texture shown in FIG. 4. This is clear from the ion image of cross section of film by FIB (focused ion bombardment). Namely, the projections and depressions observed as texture in FIG. 4 are of the secondary structure. This secondary structure of projections and depressions is formed both where the ZnO film is deposited on an uneven metal layer and where the ZnO film is deposited on a flat metal layer. Further, it was verified that, in the case where the metal layer+ZnO layer (this stack structure will also be referred to as a reflecting layer) were used to make a solar cell, this structure had the effect of increasing the short-circuit current density $J_{SC}$ of the solar cell because of optical confinement. This effect of increasing JS, is also observed with the ZnO film of FIG. 4, and the effect becomes gradually clearer as the thickness is increased to about 4 μm. This is probably because the size of the projections and depressions becomes close to the wavelength region of reflection utilization light of the solar cell. Therefore, JSC will be decreased if the temperature for forming ZnO during sputtering or the thickness is decreased.

As described above, the solar cell having the very good effect of increasing $J_{SC}$, can be obtained when the ZnO film is formed in the thickness over 4 μm by sputtering. In this case there are, however, significant industrial issues, including (1) the use amount of material is large, thereby decreasing the throughput of the deposition apparatus and in turn increasing the depreciation cost, thus posing the problem of high cost and (2) a thick and dense film is fragile when deposited on a flexible substrate, thus posing a problem in application thereof, for example, where the solar cell is formed on such a flexible substrate as an SUS plate.

Figure 5:
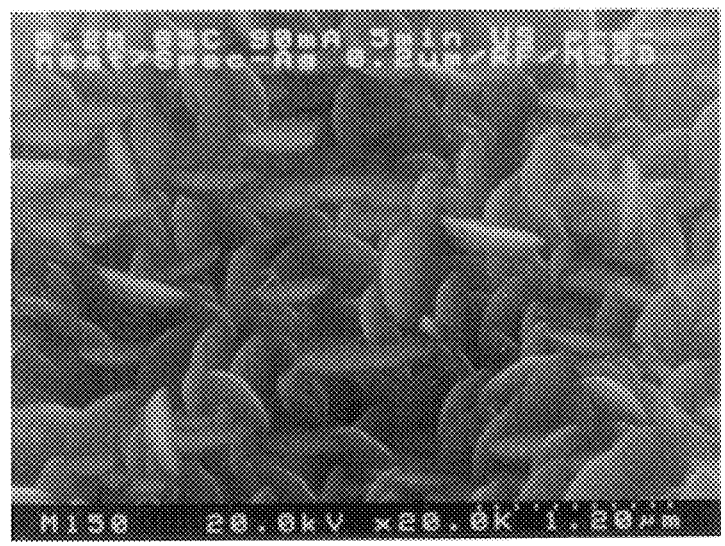
FIG. 5 is an SEM image of a surface of a zinc oxide layer having the c axis slantindicular to the substrate, made by electrodeposition.

FIG. 5 shows an example of a surface SEM image of a ZnO film which was deposited by electrodeposition on a flat surface in which silver was deposited on an SUS430 substrate having a flat surface as treated by BA (bright annealing). The ZnO film was electrodeposited in the thickness of about 1.2 μm at 85° C. and at the current density of 3.6 mA/cm$^2$ with a zinc nitrate solution of 0.2 mol/l mixed with dextrin of 0.07 g/l.

Crystal grains are observed in the above ZnO film made by electrodeposition and, according to analysis with XRD (X-Ray diffraction system), the crystals are exactly hexagonal ZnO but have the inclined c axis. The c axis direction is considered to be normal to the facet of the crystal grains. The contrast of the SEM image is enhanced and, therefore, the actual projections and depressions are not so large as those judged from FIG. 5 and are approximately 60 to 80% of the thickness even in portions appearing black. It is thus easy to form the solar cell with little shunt by forming necessary members on this layer. The solar cell obtained exhibits the exceedingly desired result as to $J_{SC}$.

In the polycrystal grain structure seen in FIG. 5, the direction of the c axis can be changed by the concentration of the electrodeposition solution in the electrodeposition step and the grain sizes of crystal grains can be changed to some extent by either of the concentration and temperature of the electrodeposition solution, the current density of electrodeposition, and texture of the base substrate.

Therefore, an optimum layer can be selected for the reflecting layer of solar cell by combining these electrodeposition conditions.

Since the above ZnO film by the electrodeposition method basically has the great advantage of capability of being formed industrially at low cost and demonstrates the sufficient optical confinement effect even in the form of a relatively thin film, the solar cells can be provided as practical products that can be widely applied.

ZnO itself is transparent to the sunlight that the solar cell utilizes, and thus the metal layer as a reflecting member is necessary for achieving the optical confinement effect. For utilizing the solar cells as widely applicable products, it is better to form a resin-laminated module, but it is known that this solar cell module allows moisture to permeate into the film, thereby causing electrochemical migration or corrosion. Therefore, the above metal layer needs to be selected from two aspects of the optical reflection property and the electrochemical stability (to prevent the electrochemical migration and corrosion).

Materials satisfying the above selection conditions include aluminum and some alloys thereof. However, the alloys are industrially disadvantageous in high volume production, because of great dependence of the optical reflection property and the electrochemical stability on the composition. Therefore, the metal layer that can be used is limited to aluminum, including one doped with a small amount of dopant, in terms of the production cost.

No method for forming a good electrodeposited ZnO film on an aluminum layer, however, has yet been established. It can be thus conceivable to employ a combination of the ZnO film by sputtering with the ZnO film by electrodeposition, but practical stacking of these films is not easy.

The inventors investigated films of a small area. If the thickness of the ZnO film by sputtering was smaller than 500 Å dissolution thereof sometimes proceeded due the electrodeposition bath, to expose the base metal aluminum. This often resulted in unsuccessful progress of deposition of the ZnO film in the subsequent electrodeposition step. If the thickness of the ZnO film by sputtering was smaller than 1500 Å film formation onto aluminum sometimes failed to catch up with change of morphology (shape), thereby resulting in exposing the aluminum layer. This could result in unsuccessful deposition of the ZnO film by the subsequent electrodeposition method. Accordingly, to stably supply the reflecting layer, the thickness of the ZnO film by the sputtering method is desirably not less than 1500 Å.

As the thickness of the above sputtered ZnO film approaches 1 μm, the cost merit rarely vanishes. It was further clarified that, for example, where the thickness of the sputtered ZnO film was set to 2000 Å, the uneven shape of the surface of the ZnO film deposited by electrodeposition varied depending upon the thickness of the base aluminum layer and the film-forming substrate temperature in the sputtering step.

The inventors conducted further studies using an apparatus adapted to a long substrate advantageous in production. Using the long substrate of SUS430 having a 2D-treated surface, a metal aluminum film was deposited in the thickness of 1000 Å or 2000 Å in the sputtering apparatus illustrated in FIG. 3, which will be described hereinafter, and the ZnO film 2000 Å thick was deposited with changes of the substrate temperature in the range of 70° C. to 400° C. by the sputtering method. Then the ZnO layer was further electrodeposited in the thickness of 1.2 μm on each sputtered ZnO film by the electrodeposition apparatus of FIG. 2 described hereinafter, thereby forming the reflecting layer. Surface SEM images of the respective reflecting layers are shown in FIGS. 5, 6A, 6B, 7A, 7B, 8A, 8B, 9A, 9B, 10A and 10B. A surface oxidation process by an oxygen plasma was carried out immediately after the formation of the metal aluminum layer by sputtering. This is a process for preventing reduction at the interface of the sputtered ZnO film to the metal aluminum layer to prevent degradation of characteristics, rather than to achieve enhancement of the characteristics. They were produced under the same conditions except for the thicknesses of the metal aluminum layer and the substrate temperatures for deposition of the sputtered ZnO film.

In each of FIG. 6A, FIG. 7A, FIG. 8A, FIG. 9A, and FIG. 10A the thickness of the metal aluminum layer is 1000 Å and in each of FIG. 6B, FIG. 7B, FIG. 8B, FIG. 9B, and FIG. 10B the thickness of the metal aluminum layer is 2000 Å.

Figure 6A:
FIG. 6A and FIG. 6B are SEM images of electrodeposited ZnO films in the surface of the reflecting layer where the ZnO films were formed at the substrate temperature of 400° C. in the sputtering step.
Figure 6B:
Figure 7A:
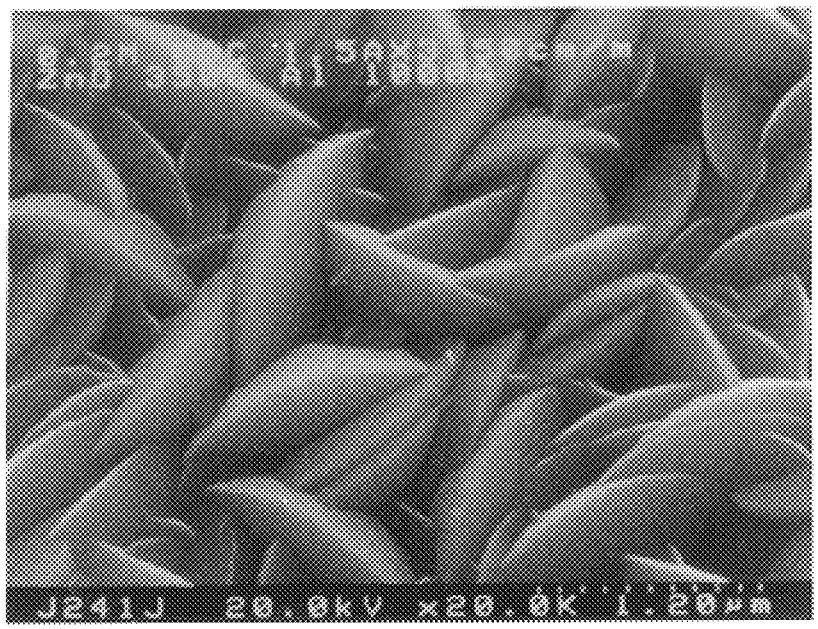
FIG. 7A and FIG. 7B are SEM images of electrodeposited ZnO films in the surface of the reflecting layer where the ZnO films were formed at the substrate temperature of 350° C. in the sputtering step.
Figure 7B:
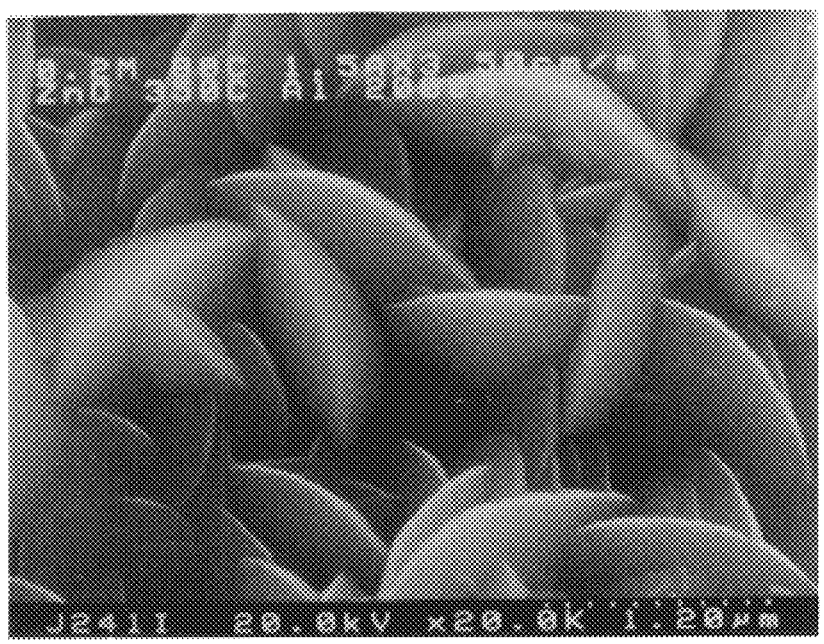
Figure 8A:
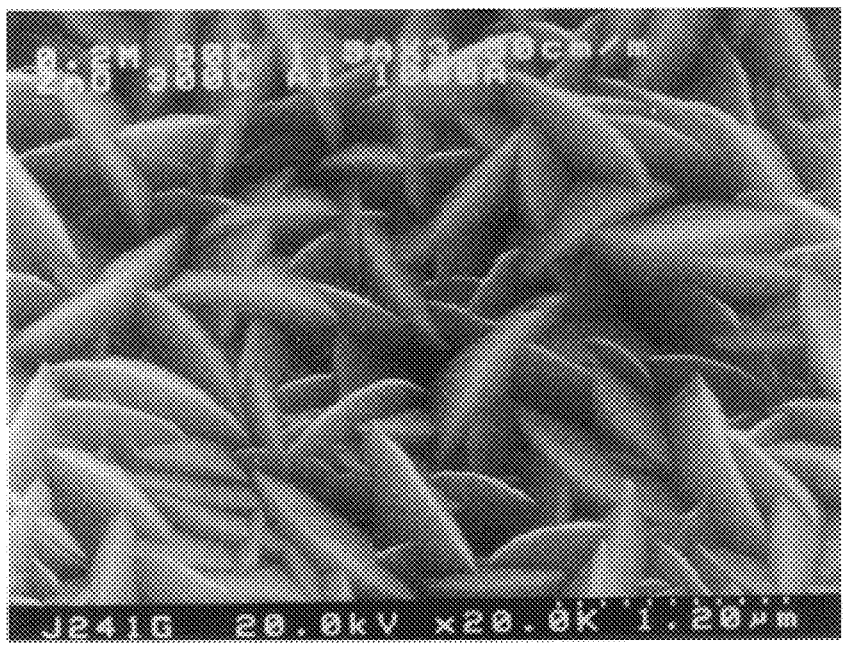
FIG. 8A and FIG. 8B are SEM images of electrodeposited ZnO films in the surface of the reflecting layer where the ZnO films were formed at the substrate temperature of 300° C. in the sputtering step.
Figure 8B:
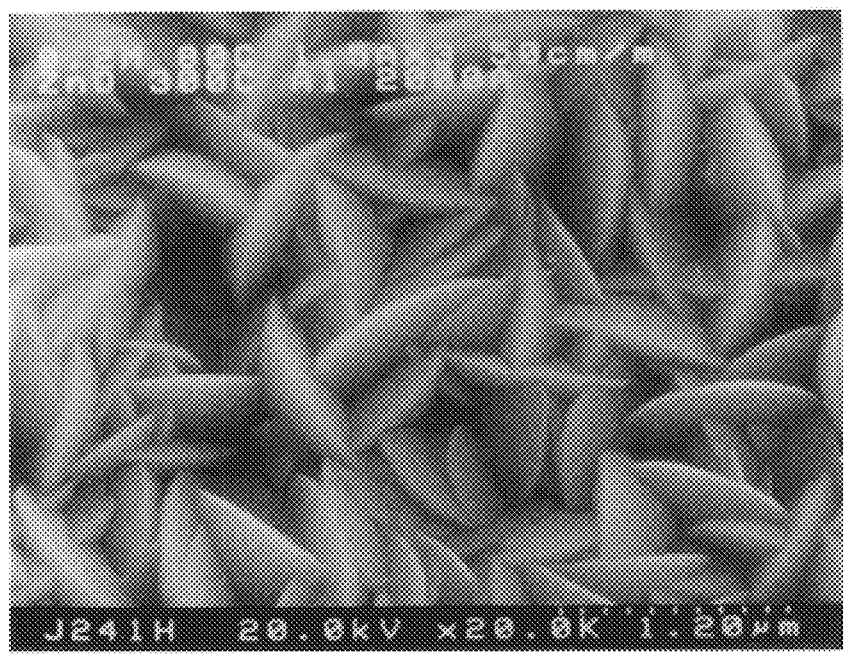
Figure 9A:
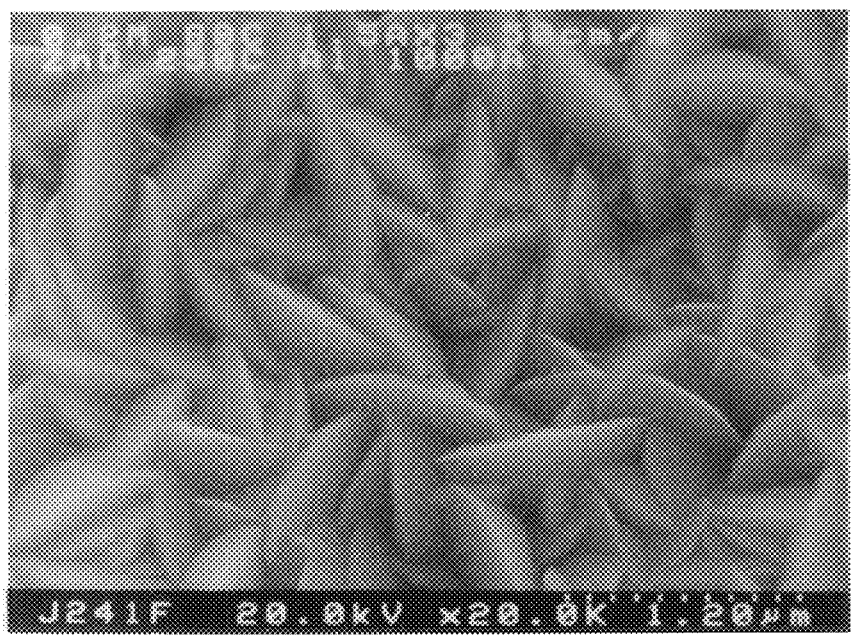
FIG. 9A and FIG. 9B are SEM images of electrodeposited ZnO films in the surface of the reflecting layer where the ZnO films were formed at the substrate temperature of 250° C. in the sputtering step.
Figure 9B:
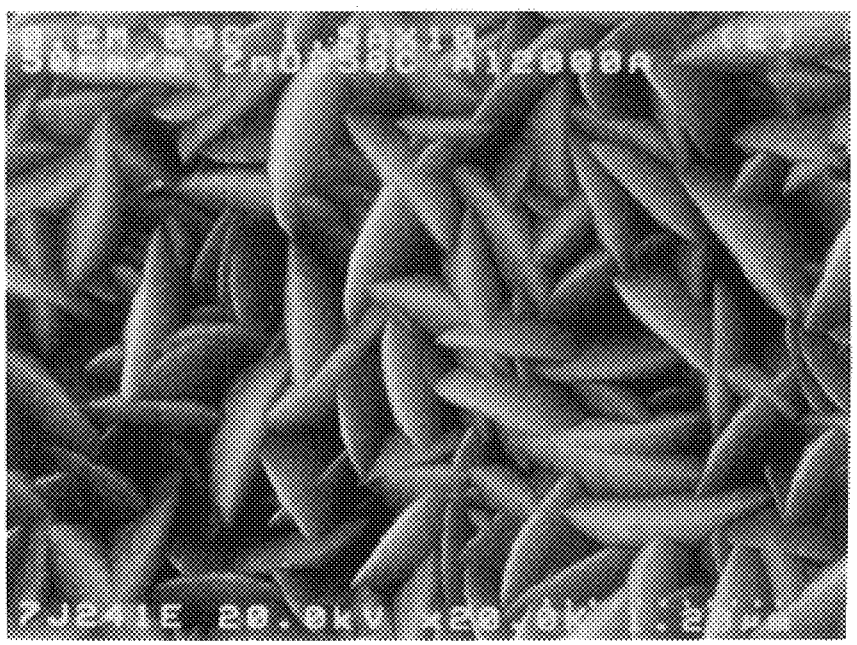
Figure 10A:
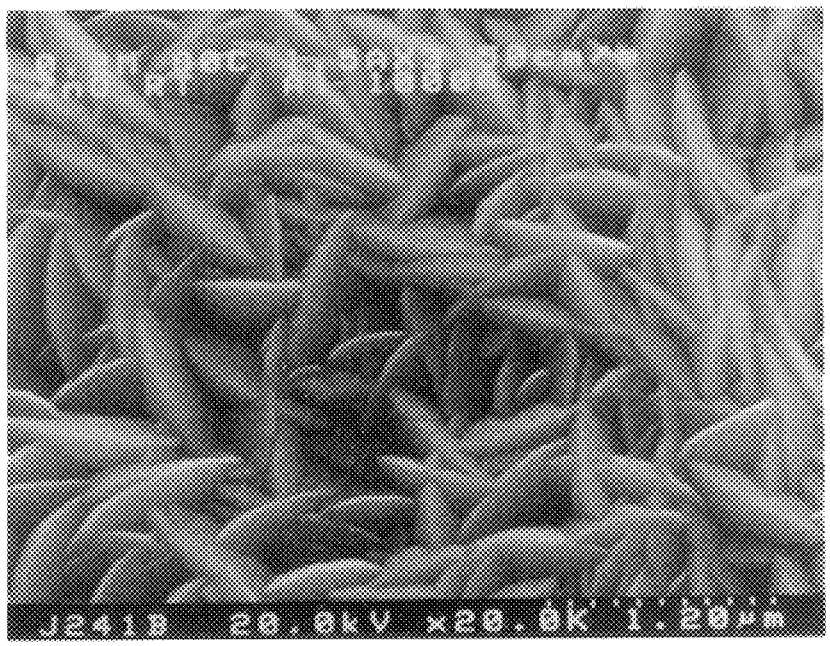
FIG. 10A and FIG. 10B are SEM images of electrodeposited ZnO films in the surface of the reflecting layer where the ZnO films were formed without heating the substrate in the sputtering step.
Figure 10B:
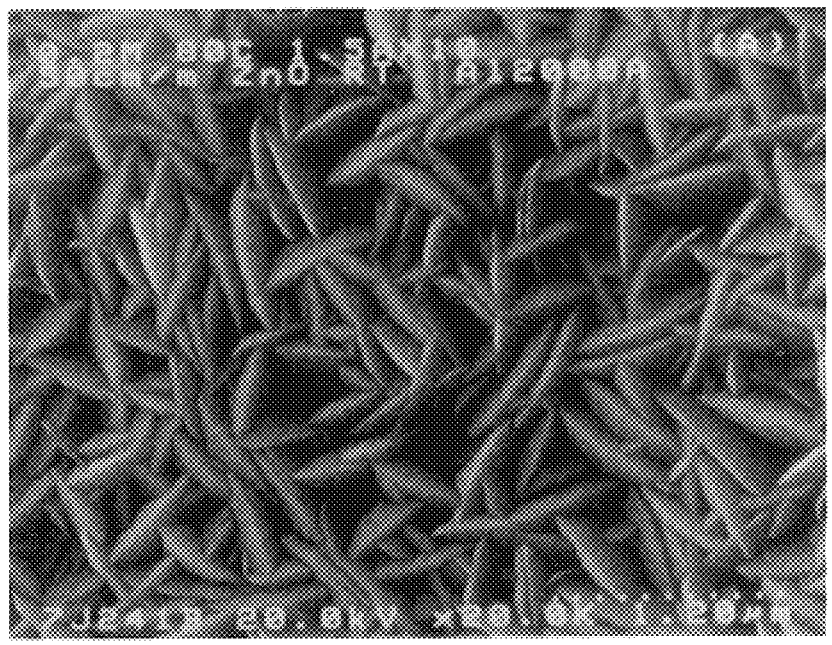

FIGS. 6A and 6B show the samples made at the substrate temperature of 400° C., FIGS. 7A and 7B the samples at the substrate temperature of 350° C., FIGS. 8A and 8B the samples at the substrate temperature of 300° C., FIGS. 9A and 9B the samples at the substrate temperature of 250° C., and FIGS. 10A and 10B the samples at the effective substrate temperature of 70° C. without heating. As apparent from FIGS. 6A, 6B to FIGS. 10A, 10B, there are great differences in the morphology of the films even though the ZnO films were electrodeposited in the thickness of 1.2 um by the same electrodeposition apparatus. This is the fact first found by the inventors. The films have respective physical quantities and industrial quantities different from each other.

Figure 11:
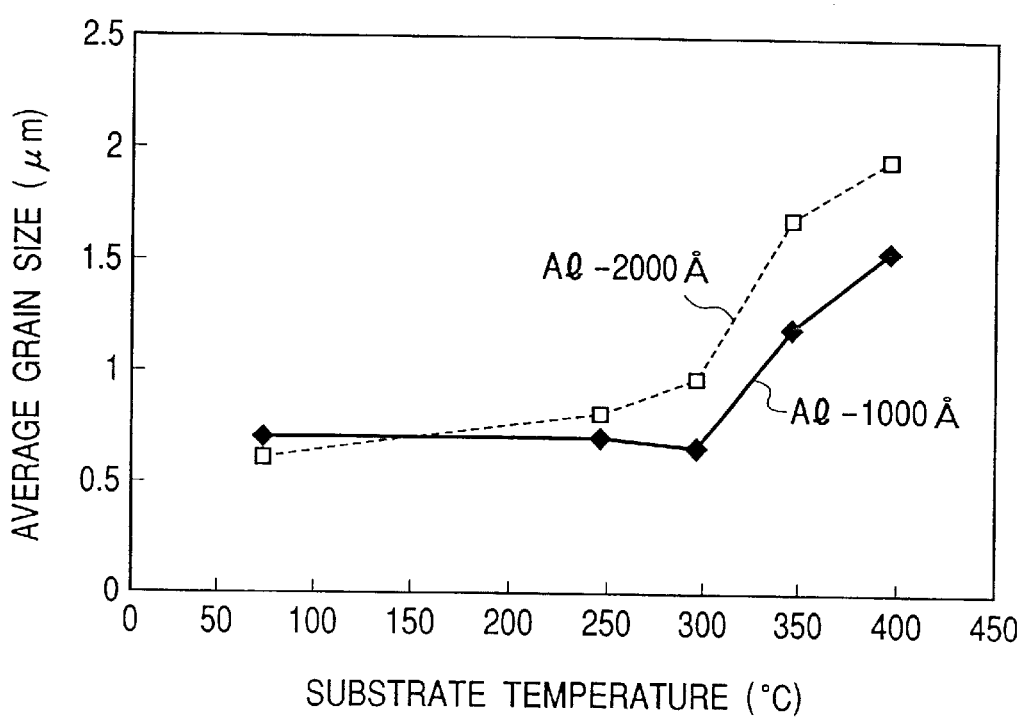
FIG. 11 is a diagram to show the dependence of average grain size of crystal grains in the surface of electrodeposited ZnO film, on substrate temperature during deposition of sputtered ZnO film.

FIG. 11 shows the dependence of the average grain size of crystal grains in the outermost surface of the reflecting layers shown in FIGS. 6A, 6B to FIGS. 10A, 10B, on the substrate temperature during the deposition of the sputtered ZnO film. The average grain size is an average of longer diameters of semicircular crystal grains measured in the SEM images of FIGS. 6A, 6B to FIGS. 10A, 10B. There is little formation of unevenness observed in the surfaces of the sputtered ZnO films and there is no great difference among SEM images thereof. However, there are clear differences in the morphology of crystal grains of ZnO electrodeposited on the sputtered ZnO films. The dependence of the average grain size of the crystal grains on the substrate temperature has a threshold. There is no clear difference in development of the average grain size of crystal grains at temperatures lower than the threshold temperature, but the longer diameters increase with increasing temperature over the threshold temperature. Further, the metal aluminum layers of the greater thickness are affected more by the substrate temperature. It is inferred from this fact that the sputtered ZnO films produce differences of their surfaces, which are assumed to be fine projections and depressions, depending upon the difference of the substrate temperature during their deposition, and such differences basically affect formation of the morphology of the electrodeposited ZnO films.

Figure 12:
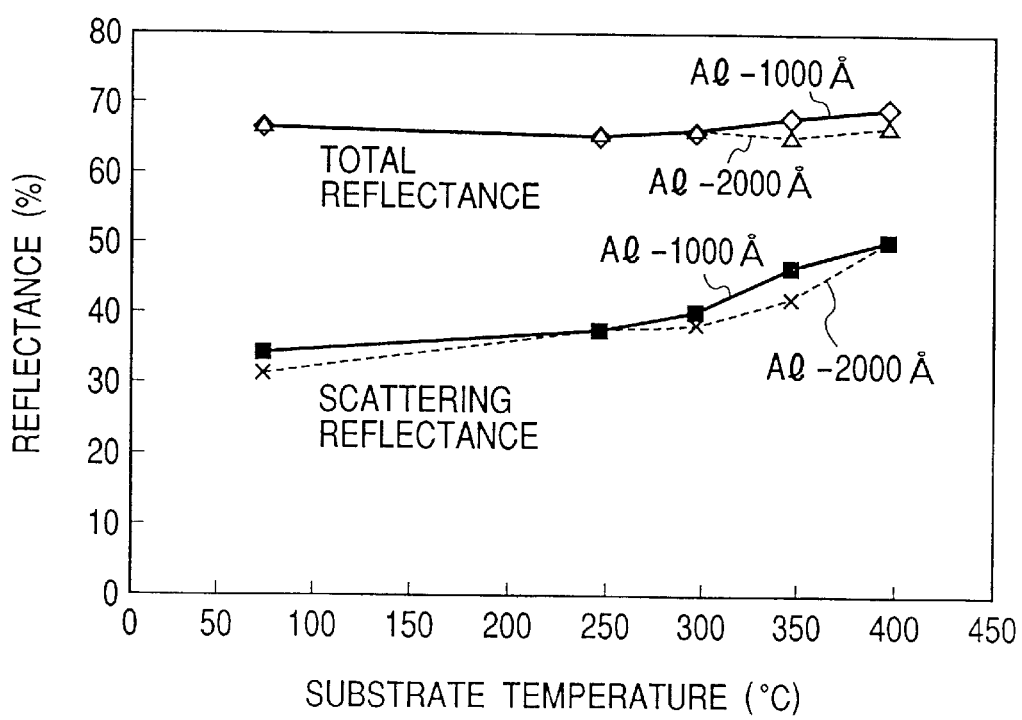
FIG. 12 is a diagram to show the dependence of reflectance of reflecting layer, on substrate temperature during deposition of sputtered ZnO film.

FIG. 12 shows the dependence of the total reflectance and scattering reflectance of the reflecting layers shown in FIGS. 6A, 6B to FIGS. 10A, 10B, on the substrate temperature during deposition of the sputtered ZnO film. The total reflectance is a factor including direct reflectance and scattering reflectance measured by an integrating sphere and the scattering reflectance is a factor obtained by subtracting the direct reflectance from the total reflectance. Greater values are more preferable for the both reflectances. It is, however, noted that the illustration of FIG. 12 represents evaluation of values at 800 nm from spectra of the total reflectance and scattering reflectance. The evaluation of values at 800 nm is based on an average of peaks and bottoms due to the interference in the reflection spectrum around 800 μm. Accordingly, they are evaluated as being smaller than actual values of reflectance. Values of peaks and bottoms show almost the same values in the case of stacked specular films as long as their thicknesses and indices of refraction are equal in the same wavelength region. In the cases of the reflecting films shown in FIGS. 6A, 6B to FIGS. 10A, 10B, their average thicknesses and refractive indices can be assumed to be almost equal, and thus it can be considered that they almost reflect the slate of scattering of light.

It is seen from FIG. 12 that the total reflectance is constant, regardless of the morphology of the surface, (which indicates that there is no abnormal absorption of light due to formation of the textured surface) and the scattering reflectance is gradually increasing as the substrate temperature during deposition of the sputtered ZnO film increases over a specific value. This is similar to the dependence of average grain size of crystal grains shown in FIG. 11, from which it is clear that the increase of projections and depressions contributes to scattering reflection. It is, however, necessary to pay attention to the fact that the scattering reflection of light also appears great, for example, where a mirror is inclined, i.e., the scattering reflection is not always effective in increasing is, of solar cell.

Figure 13:
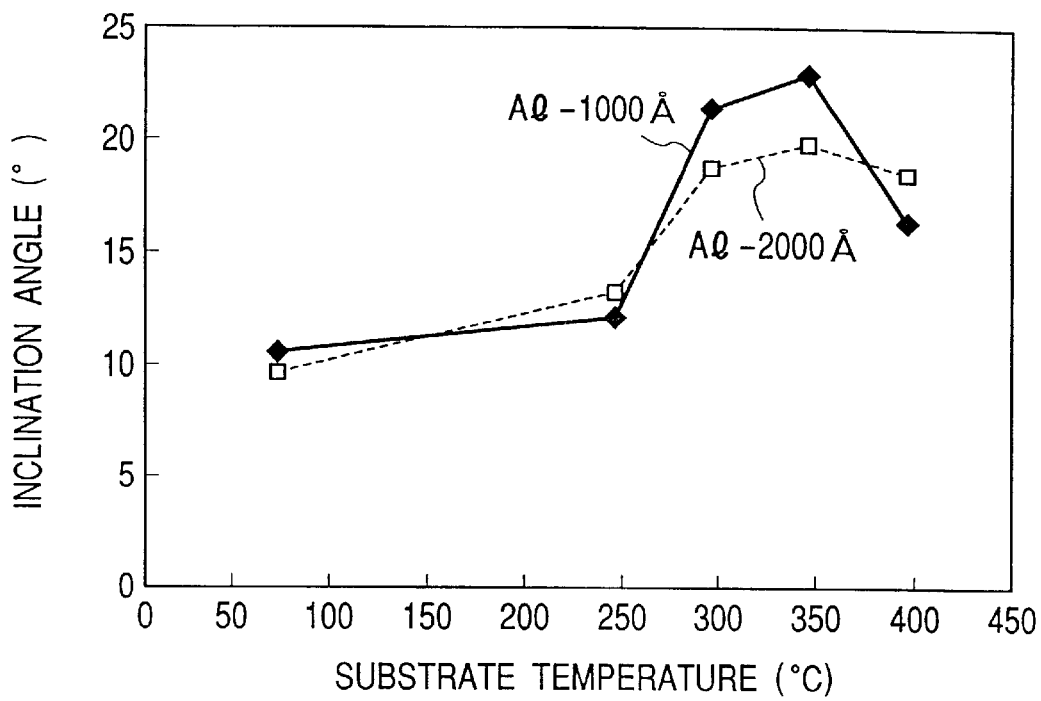
FIG. 13 is a diagram to show the dependence of average of inclination angles of crystal grains in the surface of electrodeposited ZnO film, on substrate temperature during deposition of sputtered ZnO film.

FIG. 13 shows the dependence of the average of inclination angles of crystal grains in the surfaces of the reflecting layers shown in FIGS. 6A, 6B to FIGS. 10A, 10B, on the substrate temperature during deposition of the sputtered ZnO film. The average of inclination angles of crystal grains was obtained by scanning the surface of each of the reflecting layers of FIGS. 6A, 6B to FIGS. 10A, 10B by AFM (atomic force microscope). The average increases as inclined portions increase. Namely, it is basically mentioned that the average increases as the projections and depressions become larger. Even with the development of projections and depressions, however, it becomes more difficult to make an accurate judgment of inclined portions where the peak and bottom portions include flat portions or where the scanning direction of probe traverses an inclined portion. Since the AFM itself is not always suitable for scanning of a wide area, reliability thereof is not so high for large projections and depressions. In practice, FIG. 13 shows that a clear rise appears against the substrate temperature during deposition of the sputtered ZnO film in either case of the thickness of the metal aluminum layer of 1000 Å and 2000 Å. According to the SEM images, the average of inclination angles at 400° C. seems to support the increase of flat portions of peaks and bottoms where the thickness of the metal aluminum layer is 1000 Å; whereas it seems that in the case of the thickness of 2000 Å, an accurate slope was not obtained because of exceeding growth of crystal grains. In either case the inclination angle is smaller than at 350° C.

Figure 14:
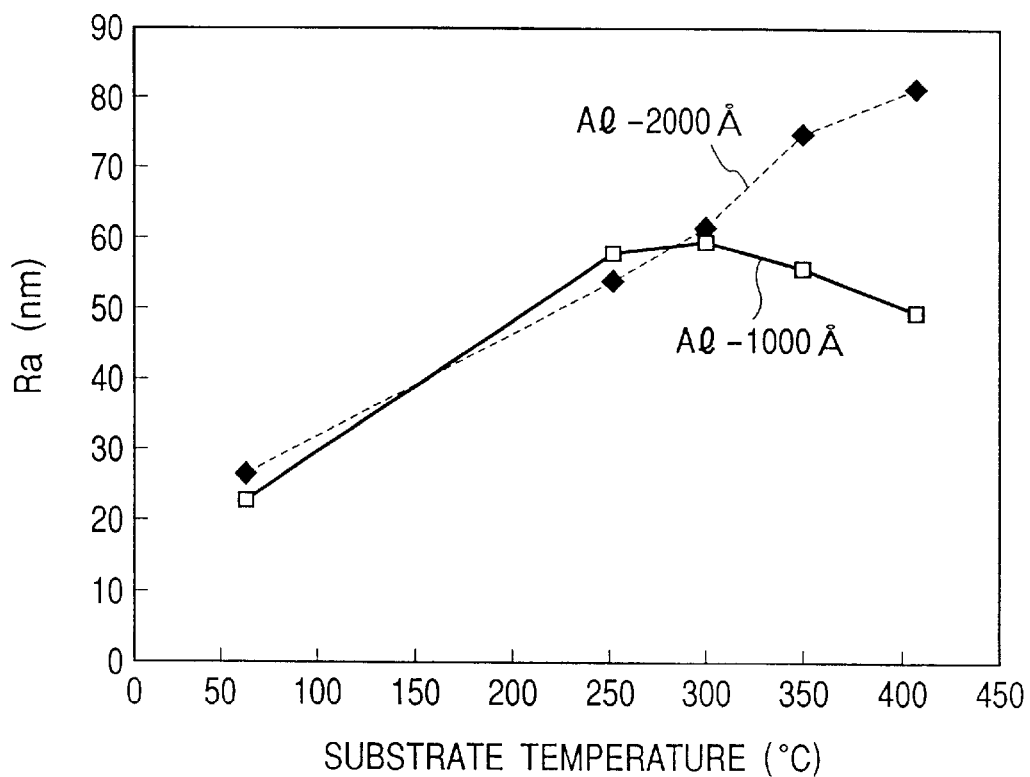
FIG. 14 is a diagram to show the dependence of surface roughness Ra of electrodeposited ZnO film, on substrate temperature during deposition of sputtered ZnO film.

FIG. 14 shows the dependence of the surface roughness Ra of the reflecting layers shown in FIGS. 6A, 6B to FIGS. 10A, 10B, on the substrate temperature during deposition of the sputtered ZnO film. Ra indicates the average roughness, which is an average of vertical deflections of the probe of the AFM. Ra almost linearly increases where the metal aluminum layer is 2000 Å; whereas Ra starts decreasing from midway where the metal aluminum layer is 1000 Å. It is judged that this result reproduces actual degrees of peaks and bottoms in the projections and depressions relatively well. The reason why the average roughness starts decreasing from midway where the metal aluminum layer is 1000 Å is considered to be that the grain sizes of crystal grains became too large to leave a room for vertical growth of electrodeposited ZnO. It is assumed that the same phenomenon possibly occurs at lower temperatures (though it is not practical) even if the metal aluminum layer is 2000 Å.

Solar cells were actually made in the same structure using the above reflecting layers and tendency thereof was investigated. The solar cells produced were of the triple structure comprised of a stack of three pin structures using amorphous silicon and amorphous silicon germanium for three types of active layers, in which the light absorbing region ranged from 300 nm to 1100 nm and in which, particularly in the region of not less than 700 nm, the light having passed once was reflected by the reflecting layer to be reused. In order to evaluate absorption of light contributing to collected current, total current by Q-measurement was evaluated instead of measuring $J_{SC}$ itself. $J_{SC}$ can be maximized by adjusting thicknesses of the triple active layers so as to eliminate a current mismatch. As a consequence, there were differences in the total current; 23.5 mA/cm² with the solar cells using the reflecting layers of FIG. 7A, FIG. 8A, and FIG. 8B; 23.1 mA/cm² with the solar cell using the reflecting layer of FIG. 7B; approximately 21 to 22 mA/cm² with the solar cells using the other reflecting layers. Particularly, in the case of the solar cell using the reflecting layer of FIG. 6B, it showed the reflection property and inclination angle, which while not bad, was still inferior in the Q total current value, 21.8 mA/cm².

From the results of these studies, increasing the scattering reflectance and the inclination angle is effective in order to maximize $J_{SC}$, i.e., in order to achieve effective optical confinement. However, excessive increase thereof will cause the inverse effect; it is, therefore, understood that values of those should be increased within the scope not exceeding the values determined by the average grain size of crystal grains and easy to judge Ra. On the other hand, the longer diameters of crystal grains and Ra are not appropriate for determination of small values, because errors become large. It is thus concluded that the lower limit of the substrate temperature during deposition of the sputtered ZnO film is preferably set based on the scattering reflectance and the inclination angle and the upper limit thereof is preferably set based on the average grain size of crystal grains and Ra.

In the above studies, after the metal aluminum layer was formed by sputtering as described above, the surface thereof was subjected to an oxidation process with an oxygen plasma. Omission of this process will result in decreasing the reflectance, thereby making the surface look black in visual observation. Such a layer is rather unpreferable as a reflecting layer. However, effecting this process too strongly is not preferred, either.

The forming steps and each of the members of the reflecting layer according to the present invention will be described below.

Figure 2:
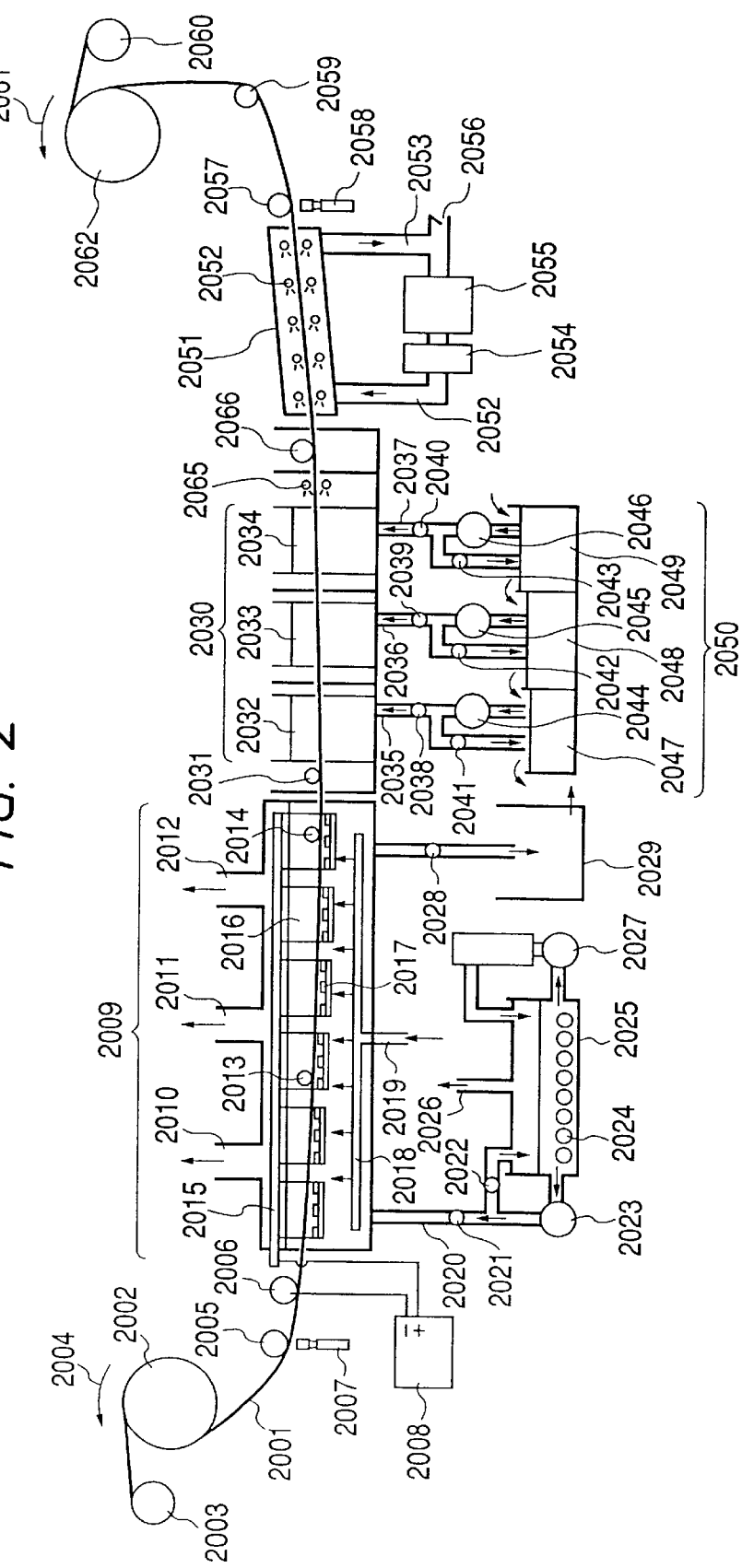
FIG. 2 is a schematic diagram to show the structure of an electrodeposition system which can be applied to the forming method of the present invention.

The first description refers to the schematic diagram of FIG. 2, which is an electrodeposition apparatus used in the step of forming the zinc oxide layer having the c axis slantindicular to the substrate in the present invention. The electrodeposition apparatus has an electrodeposition tank, washing facilities, and a drying device placed between a substrate feeding mechanism and a substrate winding mechanism, as illustrated in FIG. 2.

The long substrate 2001 is conveyed in the packing style of the coil shape rolled around a bobbin to this apparatus. In this apparatus, this coil is set on substrate feed roller 2002 and the substrate is conveyed toward substrate winding roller 2062 while a slip sheet interleaved for protection of surface is unwound by slip winding roller 2003. Specifically, the substrate 2001 moves via tension detecting roller 2005 and power supply roller 2006 into the electrodeposition tank 2009. Inside the electrodeposition tank 2009 the substrate is positioned by support rollers 2013 and 2014 and electrodeposition is effected thereon. Then the substrate is fed into the washing tank 2030 to be washed by water. Positioning inside the washing tank 2030 is effected by support rollers 2031 and 2066. Further, the substrate is dried in hot air drier 2051 and then passes support roller 2057 and meander correcting roller 2059 to be corrected for horizontal deviation. The substrate is wound up around the substrate winding roller 2062 while a new slip sheet is interleaved from slip feed roller 2060 for protection of the surface of deposited film. It is then sent to the next step as needed.

The tension detecting roller 2005 operates to detect dynamic winding tension of the long substrate 2001 and feed the detection result back to an unrepresented brake means such as a powder clutch or the like linked to the shaft of substrate feed roller 2002, thereby keeping the tension constant. The apparatus is designed so that this arrangement can keep the conveying path of the long substrate 2001 under a predetermined value of tension between the support rollers. Particularly, in the case of the apparatus of FIG. 2, which is constructed in such structure that no roller touches the film-forming surface, weak tension will result in posing a problem that the long substrate 2001 is dismounted from the support rollers or a problem that the long substrate 2001 becomes suspended down at the entrance or the exit of the electrodeposition tank 2009 or the washing tank 2030, thereby scrubbing and damaging the film-forming surface. The structure of the apparatus adapted to avoid the contact of the film-forming surface has the advantage of preventing the film-forming surface from being damaged or contaminated and is preferable, particularly, in the application where the micron size texture has to be formed on a thin film, for example, in the case of the reflecting layer of the solar cell.

The power supply roller 2006, provided for applying a cathode-side potential to the long substrate 2001, is placed as near to the electrodeposition bath 2016 as possible, and is connected to the negative electrode of power supply 2008.

The electrodeposition tank 2009 is arranged to retain the electrodeposition bath 2016 and to define the path of the long substrate 2001. Anodes 2017 are set with respect to the path of the long substrate and a positive potential is applied from the power supply 2008 via power supply bar 2015 to the anodes 2017. This allows the electrochemical, electrolytic deposition process with the long substrate 2001 being negative and the anodes 2017 being positive in the electrodeposition bath 2016. When the electrodeposition bath 2016 is kept at high temperature, a considerable amount of water vapor is formed. Therefore, water vapor is exhausted through vapor exhaust ducts 2010 to 2012. In order to agitate the electrodeposition bath 2016, air is introduced through agitating air inlet pipe 2019 to effect bubbling of air from air outlet pipe 2018 inside the electrodeposition tank 2009.

An electrodeposition circulation tank 2025 is provided for replenishing the high-temperature electrodeposition bath solution to the electrodeposition tank 2009. A heater 2024 is set in this tank 2025 to heat the electrodeposition bath solution and this bath solution is supplied from bath circulation pump 2023 through electrodeposition bath supply pipe 2020 to the electrodeposition tank 2009. The electrodeposition bath solution overflowing the electrodeposition tank 2009 and a part of the bath solution to be positively returned, are returned through an unrepresented return path to the electrodeposition circulation tank 2025 to be heated again. When the discharge of the pump is constant, the bath supply amount from the electrodeposition circulation tank 2025 into the electrodeposition tank 2009 can be controlled by valves 2021 and 2022, as illustrated in FIG. 2. Specifically, for increasing the supply amount, the valve 2021 is opened more and the valve 2022 is closed more. The inverse operation is carried out in order to decrease the supply amount. The retained level of the electrodeposition bath 2016 is controlled by adjusting this supply amount and the return amount not illustrated.

The electrodeposition circulation tank 2025 is provided with a filter circulation system comprised of a circulation pump 2027 and a filter so as to be able to remove particles in the electrodeposition circulation tank 2025. If the supply and return amounts are sufficiently large between the electrodeposition circulation tank 2025 and the electrodeposition tank 2009, the sufficient particle removing effect can be achieved by the structure in which only the electrodeposition circulation tank 2025 is provided with the filter as described above.

In the apparatus illustrated in FIG. 2, the electrodeposition circulation tank 2025 is also provided with a vapor exhaust duct 2026 to exhaust water vapor. Particularly, the heater 2024 is set as a heating source in the electrodeposition circulation tank 2025, so that water vapor forms considerably therein; therefore, the above structure is very effective in cases where unintentional discharge or dew condensation of water vapor evolving is not preferred.

An electrodeposition preliminary tank 2029 is provided in order to prevent the heated bath solution from flowing into the existing waste liquid system, at once so as to damage the disposal system and is arranged to temporarily retain the electrodeposition bath 2016 from the electrodeposition tank 2009 and to eventually evacuate the electrodeposition tank 2009 in order to enhance the efficiency of work.

The long substrate 2001 after electrodeposition in the electrodeposition tank 2009 is then conveyed into the washing tank 2030 to be washed with water. Inside the washing tank 2030 the long substrate 2001 is positioned by the support rollers 2031 and 2066 and passes through first washing tank 2032, second washing tank 2033, and third washing tank 2034 in this order. Each washing tank is provided with a washing circulation tanks 2047 to 2049 and a water circulation pumps 2044 to 2046 and a water supply amount to the washing tank 2030 is determined by two valves, i.e., valves 2038 and 2041, or 2039 and 2042, or 2040 and 2043. The cleaning water is supplied through the supply pipes 2035 to 2037 to each washing tank 2032 to 2034. The method for controlling the water supply amount by the two valves is the same as the bath supply amount control method in the electrodeposition tank 2009. Just as in the electrodeposition tank 2009, it can also be contemplated that overflowing water is collected or part of unrepresented return water to be positively returned is fed back to each washing circulation tank 2050.

In the three-stage washing system as illustrated in FIG. 2, normally, the purity of cleaning water becomes higher and higher from the upstream washing tank on the upstream of conveyance of the substrate, i.e., from the first washing tank 2032, toward the downstream washing tank, i.e., toward the third washing tank 2034. This means that cleanliness of the long substrate 2001 improves as the long substrate 2001 is conveyed to the end of the process. This results in the structure, as illustrated in FIG. 2, in which the cleaning water is first replenished to the third washing circulation tank 2049, then the cleaning water overflowing from the third washing circulation tank 2049 is replenished to the second washing circulation tank 2048, and the cleaning water overflowing from the second washing circulation tank 2048 is further replenished to the first washing circulation tank 2047, whereby the use amount of water can be drastically decreased.

The long substrate 2001 after completion of washing is dehydrated by air knife 2065 mounted in a portion of the washing tank 2030 and is then conveyed to the hot air drier 2051. In this drier, the substrate is dried by convective air of temperature sufficient to evaporate water. The convective air for the drying is supplied by guiding hot air generated by hot air generator 2055 through filter 2054 to decontaminate the hot air and ejecting the hot air from hot air inlet pipe 2052.

Overflowing air is again collected by hot air collecting pipe 2053 to be mixed with the external air from external air inlet pipe 2056 and the mixed air is sent to the hot air generator 2055. The conveyance path of the long substrate 2001 in the hot air drier 2051 is positioned by the support roller 2066 and support roller 2057.

The meander correcting roller 2059 is adapted to correct deviation of the long substrate 2001 in the width-wise direction and to roll the substrate around the substrate winding roller 2062. A deviation amount is detected by an unrepresented sensor and the width-wise position of the meander correcting roller 2059 is controlled by rotating the roller 2059 about the fulcrum of an unrepresented arm. Normally, deviation amounts detected by the sensor and actuation amounts of the meander correcting roller 2059 are both very small, within 1 mm. When winding of the long substrate 2001, new slip paper is also supplied from the slip feeding roller 2060 for protection of the surface.

Stopper 2007 and stopper 2058 are actuated simultaneously to keep the long substrate 2001 stationary with conveyance tension thereon. This can improve operability during exchange of long substrates 2001 or during maintenance of the apparatus.

The following advantages are generally associated with using the apparatus illustrated in FIG. 2.

(1) Film deposition is very simple and easy, different from the vacuum apparatus for sputtering or the like. The apparatus does not necessitate an expensive vacuum pump and there is no need to consider a design of a power supply and surroundings of electrodes to use the plasma.

(2) The running cost is lower in most cases than when sputtering is used. Labor and apparatus are necessary for production of the target for sputtering. This raises the cost and the utilization efficiency of the target is as low as 20%. Therefore, the exchange work of targets attaches considerable weight where the throughput of apparatus is desired to increase or where the thickness of deposited film is large.

(3) The above structure is more advantageous in the running cost and the apparatus, as compared with the CVD methods and vacuum evaporation methods other than sputtering.

(4) The film obtained is of polycrystalline grains in most cases and demonstrates electroconductive characteristics and optical characteristics equivalent to those prepared by the vacuum method. Thus the method of the present invention is more advantageous, as compared with the sol-gel method, the coating method using organic substance, the spray pyrolysis method, and so on.

(5) The above advantages can also be enjoyed in forming an oxide. The waste liquid can be disposed of readily, an impact on the environment is also little, and the host for prevention of contamination of the environment is also low.

Figure 3:
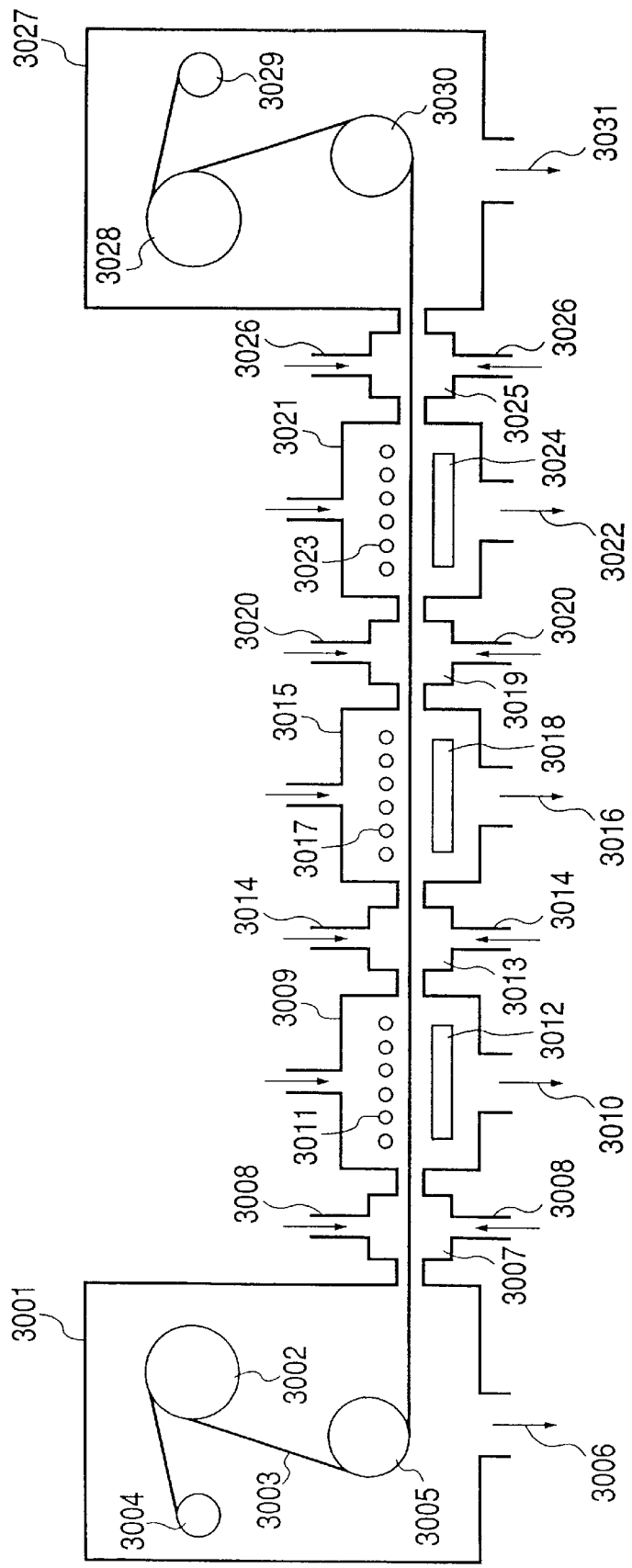
FIG. 3 is a schematic diagram to show the structure of a sputtering system which can be applied to the forming method of the present invention.

Next, described referring to the schematic diagram of FIG. 3, is a sputter apparatus used in the steps of forming the metal aluminum layer, the thin layer of aluminum oxide, and the zinc oxide layer having the c axis perpendicular to the substrate in the present invention. The sputter apparatus, as illustrated in FIG. 3, has chambers respectively for sputtering of aluminum, for an oxygen plasma process, and for sputtering of zinc oxide between a substrate feed mechanism enclosed in a vacuum chamber and a substrate winding mechanism enclosed in a vacuum chamber, the chambers being coupled to each other through a gate. The sputter apparatus will be described in detail.

The long substrate 3003 after cleaning is set in the form of the coil rolled around the bobbin, onto substrate feed roller 3002. While a slip sheet interleaved for protection of the surface is unwound by slip winding roller 3004, the long substrate 3003 is conveyed toward substrate winding roller 3028. In more detail, the long substrate 3003 is positioned by feed control roller 3005, thereafter the long substrate 3003 is conveyed successively via gas gate 3007, Al sputter chamber 3009, gas gate 3013, oxygen plasma chamber 3015, gas gate 3019, ZnO sputter chamber 3021, and gas gate 3025 to winding chamber 3027, the width-wise winding position onto the substrate winding roller 3028 is accurately controlled by meander correcting roller 3030, and the substrate is wound up onto the substrate winding roller 3028 with interleaving a slip sheet from slip feed roller 3029.

The gas gates 3007, 3013, 3019, 3025 between the chambers have a substrate conveyance path in the form of a slit as thin as 0.1 mm to 10 mm, and non-reactive gas such as argon or the like is allowed to flow thereto at several hundred sccm, whereby cross contamination is prevented between a certain chamber and a chamber connected thereto. The gas gate for prevention of cross contamination is extremely effective, particularly; where the difference in pressure between chambers is 10 or more times or where different gases are used between chambers.

In cases where the process temperature is low in the subsequent chamber, the gas at the gas gate also functions to enable temperature control in the subsequent chamber with cooling the long substrate 3003 even if the conveying speed of the long substrate 3003 is relatively high. Normally, increase of temperature can be achieved by placing a heater of several kW near the substrate, but it is hard to achieve cooling in a short period of time. Since hydrogen gas has a great cooling effect, hydrogen gas is effectively used where it is allowed to be mixed into the chambers.

An independent exhaust device not illustrated is connected to each of the substrate feed chamber 3001, Al sputter chamber 3009, oxygen plasma chamber 3015, ZnO sputter chamber 3021, and substrate winding chamber 3027 to effect evacuation as exhaust 3006, 3010, 3016, 3022, or 3031 to keep each of the chambers under corresponding low pressure. The gas at the gas gate between the chambers is evacuated through the exhausts of the adjacent chambers. Operating pressures of these chambers are not more than $\frac{1}{100}$ atm and sometimes reach $1\times10^{-7}$ Pa.

In order to realize these low pressures (which can be said as a vacuum), the exhaust devices are selected from rotary pumps, mechanical booster pumps, diffusion pumps, cryopumps, turbo-molecular pumps, sublimation pumps, and so on, with consideration to the vacuum level, the exhaust speed, and the instrument cost. An exhaust device may be a combination of these pumps. Each of the chambers and gas gates is made of SUS, Al, glass, or the like in order to maintain the vacuum and they are welded if necessary. Connection between the elements is achieved by use of a valve, fittings, gaskets, and O-rings.

There is an Al target 3012 placed inside the Al sputter chamber. Al is not only pure, but it may also contain a small amount of a metal such as Mg, Si, Fe, Mn, Ni, Co, Cr, Zn, P, or Cu. Al is normally placed on a copper backing plate, maintaining good electrical and thermal conductivity and this backing plate is cooled on the bottom surface to radiate the generated heat. A negative DC potential from an external power supply is applied to the backing plate, whereby a plasma is generated as supported by magnetism from a magnet placed behind the backing plate. To keep the plasma in good order, Ar gas is introduced up to the pressure of several mTorr to several hundred mTorr. The strength of the magnet is 100 G to several kG.

A cathode 3018 is placed inside the oxygen plasma chamber 3015. The cathode 3018 may be of any metal, but it is preferably the same material as the target used in the sputtering in the preceding step, particularly, from the aspect of preventing cross contamination. The cathode 3018 is also placed on a copper backing plate, maintaining good electrical and thermal conductivity, similar to the Al target in the Al sputtering, and this backing plate is cooled on the bottom surface to radiate the generated heat. A negative DC potential from an external power supply is also applied to the backing plate in a similar fashion to the above and the plasma is generated as supported by magnetism from a magnet placed behind the backing plate. To keep the plasma in good order, Ar gas is introduced up to the pressure from several mTorr to several hundred mTorr. In addition to the Ar gas, oxygen gas is also introduced at the rate of 0.01% to 100% into the oxygen plasma chamber 3015. Namely, the Ar gas can be absent where the plasma is generated stably and the power is very small even if the flow rate of oxygen is very low. The process power in this oxygen plasma chamber 3015 can be determined based on the reflection characteristics, and series resistance in the form of the solar cell, as detailed hereinafter, but it is normally not more than 1 kW. On the other hand, power that is too high is not preferable, because the substance of the cathode 3018 is sputtered to form a film. This limit can be experimentally obtained.

A ZnO target 3024 is placed inside the ZnO sputter chamber 3021. Mechanical arrangement and components are similar to those around the Al target. Since ZnO is an oxide having a larger electric resistance than the Al target, the DC potential applied thereto is higher. There are thus restrictions such as requirements of exacting design against abnormal discharge such as arcing or the like. Specifically, it is necessary to space the target an optimum distance apart from the earth shield so that the Ar gas may form the plasma dark space at predetermined pressure. The distance is about 4 mm in the apparatus of FIG. 3. In order to optimize the magnetron effect, the magnetic flux density by the magnet is selected in combination with the Ar pressure and the DC potential applied. Since the magnetic flux density to accomplish the magnetron condition is normally a hundred G to several hundred G, the strength of the magnet placed at some distance is set to several hundred to a thousand and several hundred G.

When sputtering of the DC magnetron method is selected, the electric resistance of the target has to be set low to a certain extent. This requires that the target is produced by the hot press method and it is thus pointed out everywhere that the cost of the target is thereby increased. It is also possible to implement RF sputtering using a target with a high electric resistance made by the cold press method. In this case, it is better to use the magnet to stabilize the discharge, but the magnet does not always have to be used. This can considerably decrease the target cost. However, the DC magnetron method is easier in designing the target in the discharge portion and can eliminate any influence due to a discharge leak, particularly, in the case of the long continuous process as illustrated in FIG. 3.

The sputter deposition of ZnO is usually carried out in Ar gas. Oxygen may be added in some cases, but the amount thereof is small. The power of discharge has to be sufficiently high and it is over 1 kW in the apparatus of FIG. 3.

The sputter apparatus as illustrated in FIG. 3 and the films deposited by the apparatus have the following advantages.

(1) The apparatus is clean because of the vapor phase process and generates no toxic substances, because the gases used are Ar, oxygen, and hydrogen. Because of the vapor phase process, influence of degassing mainly of water is little on the subsequent process. The apparatus can be adapted to the temperature range from room temperature to several hundred ° C and can thus be used for deposition of many kinds of films.

(2) The films obtained are generally dense and excellent in adhesion. A compound in a composition deviated from a stoichiometric ratio can also be deposited without much trouble. A fine or small amount of doping can also be made by using a target containing a dopant or by supplying the dopant from gas.

(3) It is known that the reflectance at 800 nm is increased by adding about 1% metal (Cu, Mg, or Ni), boron, or oxygen to Al. In this Al case, however, because absorption at the W point in the Brillouin zone is decreased by destroying crystallinity, reflectances at the other wavelengths than 800 nm are somewhat decreased at the same time.

(4) The doping effect is great with materials whose resistance is easy to vary depending upon the deposition conditions, such as ZnO or the like. If the target contains such Group I element as Li or the like, it compensates for oxygen defects in the ZnO film deposited to decrease the carrier density and increase the resistance. Conversely, if the target contains such Group III element as Al or the like, the carrier density is increased, thereby decreasing the resistance.

The morphology of ZnO by this sputtering is polycrystals of the columnar shape having the c axis perpendicular to the substrate, though the reason is not yet clear. Diameters of the columns are generally smaller than 1000 A and projections and depressions grow in the size larger than the diameters but there is a very small level of difference in the surface of the film. If the thickness of the film is small, these projections and depressions are insufficient as those used for optical confinement of the solar cell, aimed at by the present invention.

Figure 1A:
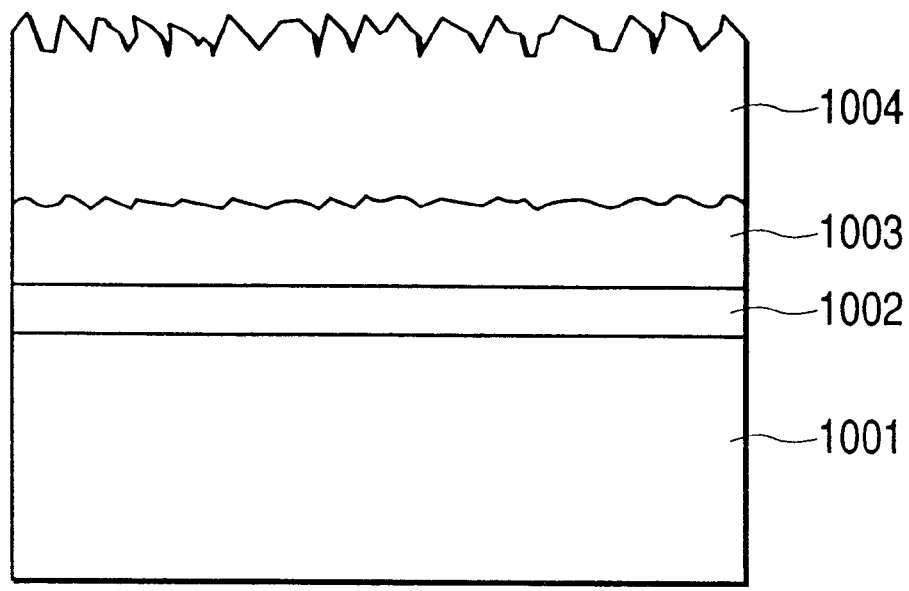
FIG. 1A and FIG. 1B are schematic sectional views of respective ZnO-layered substrates according to the present invention.
Figure 1B:
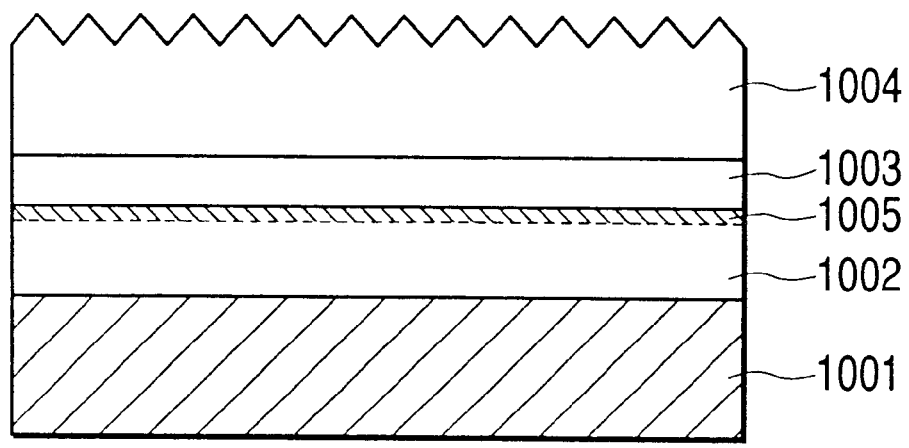

FIG. 1A is a schematic sectional view of an example of the ZnO-layered substrate of the present invention. In the drawing, reference numeral 1001 designates a support substrate (which will also be referred to hereinafter simply as "substrate"), 1002 a metal aluminum layer, 1003 a zinc oxide layer having the c axis perpendicular to the substrate, and 1004 a zinc oxide layer having the c axis slantindicular to the substrate. FIG. 1B is a schematic sectional view of another example of the ZnO-layered substrate of the present invention. In the drawing, numeral 1005 designates an aluminum oxide layer.

Substrate

In the present invention the substrate 1001 is preferably a long substrate suitable for the electrodeposition apparatus and vacuum apparatus described above and can be any material that allows electrical conduction to the flhn-forning surface and that is resistant to the electrodeposition bath 2016. Specifically, it can be selected from metals such as SUS, Al, Cu, Fe, Cr, and so on. Among these materials, SUS is relatively inexpensive and has excellent anticorrosion properties in consideration of carrying out the device-forming process in the subsequent step and is also excellent as a long substrate. The surface of the substrate 1001 may be either flat or rough. Further, another electroconductive material may also be deposited on these substrates and an appropriate substrate is selected depending upon the purpose of electrodeposition.

Metal Aluminum Layer

The aluminum for formation of the metal aluminum layer 1002 suitable for the metal layer of the present invention can be selected from pure Al (the purity 5 N), Al containing Si, Cu, Mg, Zn, Ni, Cr or the like, and alloys of Al. The material suitable for formation by the sputtering method is Al metal in the same composition as a desired film. When the substrate temperature is not more than 100° C. during sputtering, it is easy to obtain a flat and unblackened metal aluminum layer, which is preferable.

The pure Al absorbs light near 800 nm. This overlaps with the effective light utilization area of the solar cells, particularly, those using a-Si (amorphous Si), a-Site (amorphous SiGe), microcrystalline Si, or crystalline Si, thereby decreasing utilization of reflected light. This is somewhat inconvenient. The reflectance at 800 nm may be improved by adding about 1% of a metal such as Si, Cu, Mg, Zn, Ni, or Cr, or adding oxygen, nitrogen, boron, or the like. In that case, the reflectances at wavelengths other than 800 nm are also decreased, and, therefore, the additive amount suitable for the device has to be selected. Optical characteristics can be considered to be the same as for pure Al if the additive amount is not more than 0.1%.

The morphology of the Al film deposited varies, depending upon the composition of the sputter target. Particularly, in systems with the dopant of Si, growth of microcrystals of approximately 1000 Å is observed. This is because grain boundaries become easier to create. In the present invention projections and depressions are positively made in the succeeding layer, and thus there is no need for formation of crystal grains, though there is no specific effect thereby.

In the present invention the thickness of the metal aluminum layer 1002 is preferably not less than 500 Å nor more than 1 $\mu$m. The thickness is preferably not less than 1000 Å, particularly, in order to assure the optical reflectance and it is desirably not more than 5000 Å in order to assure mechanical adhesion. Further, the thickness is more preferably not more than 2500 Å in order to keep the reflection performance of light. Where the surface is oxidized by the oxygen plasma, the total thickness of the above layer and the oxidized portion (aluminum oxide layer) is preferably determined in the above thickness ranges.

It is desirable in the present invention to form the thin film 1005 of aluminum oxide by oxidizing the surface of the metal aluminum layer 1002 in the oxygen plasma. This aluminum oxide layer 1005 is obtained by exposing the surface of the metal aluminum layer deposited by sputtering to the plasma in the oxygen plasma. This layer has a very small thickness. This thin film of aluminum oxide 1005 contains less oxygen or has the smaller thickness than aluminum oxide made of the starting material of $Al_2O_3$ in a vacuum process, aluminum oxide made in a surface of aluminum in a solution by anodization or anodic oxidation, and even a film of aluminum oxide made when exposed to severe conditions in the oxygen plasma. From the principle of production thereof, there is no possibility that substances other than aluminum oxide (which means that a film contains oxygen and aluminum) are made, and with this aluminum oxide, it is almost impossible to determine the thickness and refractive index from interference by optical measurement or to analyze the composition by XMA (X-ray microanalyzer).

It should be, however, considered that the thin film of aluminum oxide is formed due to the increase of electric resistance, which is observed with the increase of oxygen mixed into Al, and to the relaxation of the reflectance decrease with deposition of zinc oxide in the succeeding process. The extent of the formation of the aluminum oxide layer is determined from values of reflectance and electric resistance at the time of completion of film deposition in the succeeding process. Namely, the electric resistance increases with increase in the oxygen amount and thickness of aluminum oxide by increasing the mixture amount of oxygen. This is probably because characteristics of $Al_2O_3$ being an insulator appear paramount because of the increase of the stoichiometric oxygen amount. On the other hand, if the oxygen amount of the thin film of aluminum oxide is too small, cross movement of oxygen between the aluminum layer and the zinc oxide layer occurs to separate oxygen from the zinc oxide layer, thereby forming metal zinc. This decreases the reflectance. An example of this case will be explained with FIG. 15 in Example 6 described hereinafter. In this example, it can be said that the zone between two dashed lines is the characteristic range of aluminum oxide suitable for the present invention.

Zinc oxide layer having the c axis perpendicular to substrate

In the present invention the zinc oxide layer is comprised of the zinc oxide layer 1003 having the c axis perpendicular to the substrate 1001 and the zinc oxide layer 1004 having the c axis slantindicular to the substrate 1001. C axis is the principal axis of a crystal, and is in a zinc oxide crystal grain constituting the layer and can be identified by X-ray diffraction. The c axis slantindicular to the substrate means that c axis is inclined in relation to a perpendicular (or normal) direction of the substrate. Typical surface SEM (scanning electron microscope) images of the respective layers are shown in FIG. 4 and FIG. 5.

The zinc oxide layer 1003 having the c axis perpendicular to the substrate 1001 is made by sputtering and can be identified from the fact that most diffraction thereof by XRD (X-Ray diffraction apparatus) is the<0002>peak of ZnO. According to observation by FIB (focused ion bombardment), the columnar structure of columns growing as slightly spreading to the end can be observed and the diameters of the columns are approximately 1000 Å. In the SEM image shown in FIG. 4, the surface projections and depressions of the secondary structure are observed. They are assembly of several columnar crystals and only inclination smaller than 10° is observed by AFM (atomic force microscope) where the thickness of zinc oxide is about 5000 Å.

The thickness of the zinc oxide layer 1003 having the c axis perpendicular to the substrate 1001 is 500 Å to 1 $\mu$m and is preferably not less than 1500 Å because there is the possibility that it is dissolved in the subsequent electrodeposition process and directly exposed Al will be the cause of abnormal growth. The thickness should be as small as possible in terms of preventing cracks or delamination during electrodeposition and it is preferably not more than 2500 Å.

Zinc oxide layer having the c axis slantindicular to substrate

The zinc oxide layer 1004 having the inclined c axis is made simply by electrodeposition where the concentration of zinc nitrate is higher than 0.1 mol/l and it can be identified based on the fact that the<0002>peak of ZnO by XRD is smaller than that of the powder sample (the data of JCPDS card). As shown in the SEM image of FIG. 5, the polycrystal structure is extremely characteristic and is comprised of crystal grains approximately equal to the wavelengths of light that is intended to undergo the optical confinement effect purposed by the present invention. The crystal grains also grow similarly while the thickness is still small. When the thickness is over 1 $\mu$m, the inclination by AFM becomes far greater than 20° and sometimes reaches 40°. When the thickness of the zinc oxide layer 1004 having the inclined c axis is over 5000 Å, the sufficient effect of projections and depressions can be exhibited. The thickness is preferably not less than 1 $\mu$m.

When the zinc oxide layer having the c axis slantindicular to the substrate is deposited, for example, on a flat surface of copper or the like, it very often suffers delamination during bending of the substrate without any difficulties. When the zinc oxide layer having the c axis slantindicular to the substrate is deposited on the zinc oxide layer having the c axis perpendicular to the substrate, delamination is rarely observed by visual observation even with 180° bending of substrate and even in the structure in which the zinc oxide layer having the c axis perpendicular to the substrate is as thin as 1000 Å and the zinc oxide having the inclined c axis is as thick as 2 $\mu$m, however. Further, the zinc oxide having the inclined c axis seems easier to break from the SEM image, but no structural change is observed even after kept under the hydrostatic pressure of 300 kg/cm$^2$.

The total reflectance (the rate of intensity of direct light+ purely scattered light to incident light) of the reflecting layer of the present invention is measured by a reflection spectrometer using the integrating sphere. Calibration is conducted with a smooth surface sample of silver. Therefore, where a film surface is a very good scattering surface, there is the possibility that the total reflectance thereof becomes somewhat small, but it is defined using the same diffuse plate (the one attached to the spectrometer). The direct component can be measured without the diffuse plate and the scattering component, i.e., the scattering reflectance can be evaluated by subtracting the direct component from the total reflectance.

The total reflectance indicates the degree of absorption of light inside the reflecting layer formed and values thereof closer to 100% are better. When the scattering reflectance of a certain reflecting layer is close to the total reflection, the reflecting layer can be used as an excellent reflecting layer for the solar cell. Since the structure is the stack of the metal reflecting layer and the dielectric layer, the reflection spectrum demonstrates strong and weak patterns due to interference.

The total reflectance and the scattering reflectance of reflection herein are defined each as an average of maxima (maximum) and minima (minimum) around the border of 800 nm (when the dielectric layer is thick, there may be maxima and minima.). The total reflectance will never be 100% as long as interference occurs. This value is not reflected so vividly in numerical values than when observed. As a practical value, the total reflectance of 50% appears as a dark surface, by which collection of light of the solar cell is poor and $J_{SC}$ (short-circuit current density) is extremely low. On the other hand, the total reflectances over 60% show good characteristics and the total reflectances exceeding 70% cannot be achieved as long as Al is used.

The reason why 800 nm is used as an index of reflectance in the present invention is that Al has absorption thereat to show a minimum of reflection. Another reason is that 800 nm is also the wavelength that truly reflects the optical confinement effect at the same time.

The average grain size of crystal grains of the zinc oxide layer having the c axis slantindicular to the substrate, which forms the outermost surface of the reflecting layer of the present invention, is read from the SEM image (the longer diameter is read where an ellipse is observed). The grain sizes of the zinc oxide having the inclined c axis by the electrodeposition method become greater as the projections and depressions of the substrate become larger, as the concentration of the solution becomes higher, or as the temperature becomes lower. The grain sizes can also be controlled greatly by an additive such as phthalic acid.

Experiments were conducted with changes of grain sizes as described, and it was clarified from measurement of light collection efficiency (Q curve measurement) that preferable results were obtained where the grain sizes were 0.4 to 1.2 µm. Specifically, it was found that without the zinc oxide layer having the c axis slantindicular to the substrate, the current values by the measurement of light collection efficiency (which is reduced to current from carriers collected and which is the total current of bottom, middle, and top cells in the solar cell of the triple structure) were approximately 20 mA/cm$^2$, whereas with the zinc oxide layer having the c axis slantindicular to the substrate and having the grain sizes in the range of 0.4 to 1.2 µm, an improvement of about 10% was able to be achieved. Therefore, the average grain size is preferably 0.4 to 1.2 µm in the present invention as well.

The inclination angles of the crystal grains in the surface of the zinc oxide layer having the c axis slantindicular to the substrate, which forms the outermost surface of the reflecting layer of the present invention, are measured as an average angle of motions of the probe tip, using the AFM. Such a mode is normally set in the AFM.

It is known that zinc oxide having grains with the c axis perpendicular to the substrate grow in the electrodeposition method, for example, where the concentration of the solution is 0.005 mol/l. When it is formed on zinc oxide made by sputtering and having the surface slightly etched with acetic acid of 0.2%, the deposited film is the polycrystal film of zinc oxide having the c axis perpendicular to the substrate and having the grain size of 0.8 µm. When a comparison was made in this manner, it was found that the collected current became larger, generally, with increasing inclination of the c axis, and thus with increasing inclination angle by the AFM.

Very good collected current is expected when the inclination angle by AFM is not less than 15°; but it is very difficult to achieve it by the sputtering method. On the other hand, use of the electrodeposition method makes it possible by selecting the substrate, the concentration of solution, and the temperature. For that, a good result is normally achieved when the temperature is 75 to 95° C. and the concentration of the solution is 0.1 mol/l. The electric resistance of the reflecting layer of the present invention is defined as a resistance in the direction normal to the substrate per cmZ of the area of film. The electric resistance in the direction parallel to the film does not have to be taken into substantial consideration. The best evaluation method is one for forming a solar cell element by making a cell having a known resistance on the reflecting layer of the present invention and obtaining the resistance of the reflecting layer by subtracting the resistance of the above cell from the vertical resistance obtained by I–V measurement of the solar cell element. It may also be measured simply by forming electrodes of a sandwich type.

The electric resistance of the reflecting layer of the present invention is the sum of resistances of the respective bulks of the substrate 1001, the metal aluminum layer 1002, the zinc oxide layer having the c axis perpendicular to the substrate 1003, and the zinc oxide layer having the c axis slantindicular to the substrate 1004, (also including the aluminum oxide layer 1005 in the case of the surface of the metal aluminum layer being processed by the oxygen plasma process) and resistances of the interfaces. The inventors investigated this resistance by forming solar cells and checking applicable values thereof from I–V of the solar cells and it was not more than 20 n per cmz of the area of film. When the resistance was greater than this value, anomaly of I–V occurred and environmental stability of film was considerably degraded.

EXAMPLE 1

The ZnO-layered substrate was formed using the long SUS430 substrate having the width of 350 mm and the thickness of 0.15 mm with the 2D-treated surface and using the systems illustrated in FIG. 2 and FIG. 3.

The deposition conditions by the sputter apparatus of FIG. 3 were as follows: the conveyance speed of the long substrate 800 mm/min, the Al sputter power 3.2 kW, the flow rate of Ar gas during the Al sputtering 50 sccm, the substrate temperature during the Al sputtering 70° C., the power during the oxygen plasma process 0.1 kW, the flow rate of oxygen gas during the oxygen plasma process 10 sccm, the substrate temperature of the oxygen plasma process 60° C., the ZnO sputter power 3.2 kW, the flow rate of Ar gas during the ZnO sputtering 50 sccm, the substrate temperature during the ZnO sputtering 350° C., and the gas flow rates of all the gas gates 50 sccm of Ar. The thickness of Al was set to 1000 Å and the thickness of ZnO to 2000 Å.

The deposition conditions by the electrodeposition apparatus of FIG. 2 were as follows: the conveyance speed of the long substrate 500 mm/min, the concentration of the electrodeposition bath 0.2 mol/l, the temperature of the electrodeposition bath 85° C., and the current density of electrodeposition 1.2 mA/cm$^2$. Under these conditions, the zinc oxide layer having the c axis slantindicular to the substrate, comprised of polycrystals having the grain size of 1.0 µm, was formed in the thickness of 1.1 µm. The total reflectance at 800 nm was 67% and the scattering reflectance was 55%. Only interference colors looked faint in visual observation, so that the surface was a good scattering surface. The inclination angles were measured by the AFM and the average thereof was 21°. Ra was 65 nm.

Produced on this ZnO-layered substrate were triple cells of the pin structure having the active layers of a-Si in the top, a-Site in the middle, and a-SiGe in the bottom. The upper electrode of ITO was formed thereon and measurement of the solar cell was conducted under the solar simulator of AM 1.5. The series resistance per cm$^2$ was 34 Ω and the series resistance of only the triple layers was 28 Ω. Therefore, the thickwise resistance of the reflecting layer of the present example was 6 Ω. The photocurrent collected was 23.4 mA/cm$^2$, so that a great improvement was demonstrated, as compared with 20.5 mA/cm$^2$ of the reflecting layer made only by sputtering.

EXAMPLE 2

The layers were deposited according to the same procedures as in Example 1 except that the SUS substrate with the 2D-surface in Example 1 was replaced by a BA-treated substrate with a highly flat surface. It was also noted, however, that the substrate temperature during the ZnO sputtering was 380° C., instead of 350° C., because growth of projections and depressions was slow at 350° C.

The same triple cells as in Example 1 were produced on the ZnO-layered substrate thus obtained, the upper electrode of ITO was formed thereon, and the measurement of the solar cell was conducted under the solar simulator of AM 1.5. As a result, the series resistance per cm$^2$ was 30 Ω and the series resistance of only the triple layers was 28 Ω; therefore, the thickwise resistance of the reflecting layer of the present example was 2 Ω. The photocurrent collected was 23.1 mA/cm$^2$, so that a great improvement was demonstrated, as compared with 20.5 mA/cm$^2$ of the reflecting layer made only by sputtering, as in Example 1.

EXAMPLE 3

The current density of the electrodeposition was changed from 1.2 mA/cmZ in Example 1 to 5 mA/cm$^2$. The degree of formation of the projections and depressions was lowered by the degree of increase of the current. The dependence of the scattering reflectance due to the projections and depressions on the substrate temperature during deposition of the sputtered ZnO film started rising at 300° C. and it was also found that the temperature of 400° C. was too high from the judgment of the average grain size of crystal grains. Therefore, the temperature of 350° C. was selected as an optimum point.

The reflecting layer was made under the above conditions and the solar cell was formed in the same manner as in Example 1. Then the measurement was carried out. As a result, the series resistance per $cm^2$ was 35 Ω and, by subtracting the series resistance 28 of only the triple layers therefrom, the thick-wise resistance of the reflecting layer of the present example was 7 Ω. The photocurrent collected was 22.9 $mA/cm^2$, so that a great improvement was observed, as compared with 20.5 $mA/cm^2$ of the reflecting layer made by only sputtering, as in Example 1.

EXAMPLE 4

The ZnO-layered substrate was formed using the long SUS430 substrate having the width of 350 mm and the thickness of 0.15 mm with the 2D-treated surface and using the systems illustrated in FIG. 2 and FIG. 3.

The deposition conditions by the sputter apparatus of FIG. 3 were as follows: the conveyance speed of the long substrate 800 mm/min, the Al sputter power 3.2 kW, the flow rate of Ar gas during the Al sputtering 50 sccm, the substrate temperature during the Al sputtering 70° C., the power during the oxygen plasma process 0.1 kW, the flow rate of oxygen gas during the oxygen plasma process 10 sccm, the substrate temperature of the oxygen plasma process 60° C., the ZnO sputter power 3.2 kW, the flow rate of Ar gas during the ZnO sputtering 50 sccm, the substrate temperature during the ZnO sputtering 400° C., and the gas flow rates of all the gas gates 50 sccm of Ar. The thickness of Al was set to 2000 Å and the thickness of ZnO to 2000 Å.

The deposition conditions by the electrodeposition apparatus of FIG. 2 were as follows: the conveyance speed of the long substrate 500 mm/min, the concentration of the electrodeposition bath 0.2 mol/l, the temperature of the electrodeposition bath 85° C., and the current density of electrodeposition 1.2 $mA/cm^2$. Under these conditions, the zinc oxide layer having the c axis slantindicular to the substrate, comprised of polycrystals having the grain size of 1.0 μm, was formed in the thickness of 1.1 μm. The total reflectance at 800 nm was 67% and the scattering reflectance was 55%. Only interference colors looked faint in visual observation, so that the surface was a good scattering surface. The inclination angles were measured by the AFM and the average thereof was 24°.

Produced on this ZnO-layered substrate were triple cells of the pin structure having the active layers of a-Si in the top, a-Site in the middle, and a-SiGe in the bottom. The upper electrode of ITO was formed thereon and the measurement of the solar cell was conducted under the solar simulator of AM 1.5. The series resistance per $cm^2$ was 34 Ω and the series resistance of only the triple layers was 28 Ω. Therefore, the thick-wise resistance of the reflecting layer of the present example was 6 Ω. The photocurrent collected was 23 $mA/cm^2$, so that a great improvement was demonstrated, as compared with 20.5 $mA/cm^2$ of the reflecting layer made only by sputtering.

EXAMPLE 5

The SUS substrate with the 2D-surface in Example 4 was replaced by a substrate with a BA (bright annealing)-treated surface which was almost a mirror surface. On this substrate, the metal aluminum layer, the thin layer of aluminum oxide, and the zinc oxide layer having the c axis perpendicular to the substrate were made respectively in the same manner as in Example 1, using the sputter apparatus of FIG. 3. Surfaces of the films made by the sputter apparatus were almost mirror surfaces, in which a face of an observer looked reflected when visually observed. The zinc oxide layer having the c axis slantindicular to the substrate was made thereon using the electrodeposition apparatus of FIG. 2 in the same manner as in Example 1 except that the current density of electrodeposition was 2 $mA/cm^2$ to obtain the thickness of 1.8 μm.

The total reflectance at 800 nm of the reflecting layer obtained was 64%, the scattering reflectance was 47%, and the average of inclination angles was 19°; therefore, the obtained surface was a good scattering surface. The same triple cells as in Example 1 were produced on this reflecting layer and evaluation was carried out. The resistance per $cm^2$ in the direction normal to the reflecting layer was 1.3 Ω and the photocurrent collected was 22.7 $mA/cm^2$. Therefore, a good result was obtained with the BA-substrate.

EXAMPLE 6

Figure 15:
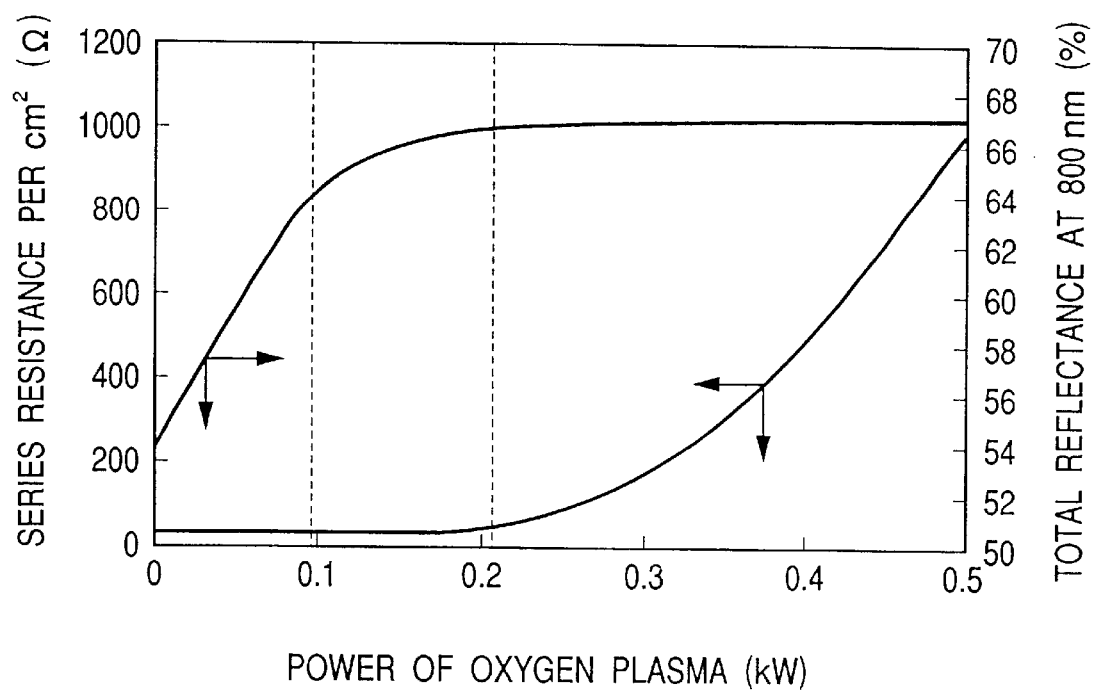
FIG. 15 is a diagram to show the dependence of series resistance and reflectance of photovoltaic device of the present invention, on power of oxygen plasma.

The reflecting layers were made in the same manner as in Example 1 except that the aluminum oxide layer thereof was made with changes in the power in the oxygen plasma process at intervals of 0.1 kW from 0 to 0.5 kW. The total reflectances of the reflecting layers, and series resistances with the same triple cells as in Example 1 were checked. The results are shown in FIG. 15. It was clear from FIG. 15 that the thin film of aluminum oxide to be formed by the oxygen plasma process was well-made by the power in the range of a little under 0.1 kW to 0.2 kW.

On the other hand, there appeared no great change in the solar cell characteristics with changes in the thickness of the metal aluminum layer and in the thickness of the zinc oxide layer having the crystal grains having the c axis perpendicular to the substrate. As the thickness of the zinc oxide layer having the crystal grains of the inclined c axis was increased, the collected photocurrent of the solar cell was gradually increased with increasing thickness.

EXAMPLE 7

The ZnO-layered substrate was made using the long SUS430 substrate having the width of 355 mm and the thickness of 0.125 mm with the 2D-surface and using the systems illustrated in FIG. 2 and FIG. 3.

The deposition conditions by the sputter apparatus of FIG. 3 were as follows: the conveyance speed of the long substrate 800 mm/min, the power of the Al sputtering 3.2 kW, the flow rate of Ar gas during the Al sputtering 50 sccm, the substrate temperature during the Al sputtering 70° C., the power of the ZnO sputtering 2.6 kW, the flow rate of Ar gas during the ZnO sputtering 50 sccm, the substrate temperature during the ZnO sputtering 250° C., and the flow rates of the gas gates all 50 sccm of Ar. The thickness of Al was set to 1000 Å and the thickness of ZnO to 1200 Å. In the present example the oxygen plasma chamber was used only for simple passage of the substrate.

The deposition conditions by the electrodeposition apparatus of FIG. 2 were as follows: the conveyance speed of the long substrate 1000 mm/min, the concentration of the electrodeposition bath 0.08 mol/l, the temperature of the electrodeposition bath 85° C., and the current density of electrodeposition 1.8 $mA/cm^2$. Under these conditions, the zinc oxide layer having the c axis slantindicular to, the substrate, comprised of polycrystals having the grain size of 0.9 mm, was made in the thickness of 0.5 mm. The total reflectance at 800 nm was 60% and the scattering reflectance was 20%. Interference colors were observed in visual observation and looked a little faint. The inclination angles were measured by the AFM and the average of inclined surfaces was 15°. Ra was 20 nm.

This reflecting layer was applied as a lower layer of a solar cell. Specifically, a single cell of the pin structure having the active layer of a-Si was made on this ZnO-layered substrate. The upper electrode of ITO was formed thereon and the measurement of the solar cell was carried out under the solar simulator of AM 1.5. The series resistance per $cm^2$ was 8.2 Ω and the series resistance of the single pin structure was 7.9 Ω. This means that the thickwise resistance of the reflecting layer of the present example was 0.3 Ω. The collected photocurrent was 15.3 $mA/cm^2$, so that a great improvement was shown, as compared with 15.0 $mA/cm^2$ of the reflecting layer made only by sputtering.

As detailed above, the ZnO-layered substrate of the present invention is excellent in the reflection performance and the optical confinement effect as a reflecting layer of a photovoltaic device and the application thereof to the solar cell will allow the photovoltaic devices with high efficiency to be formed stably and at low cost as a result.

Providing a thin film made of aluminum oxide can increase the reflectance.

When the average of inclination angles of crystal grains in the surface of the zinc oxide layer having the c axis slantindicular to the substrate is not less than 15°, the optical confinement effect is achieved in the long-wavelength region and the application thereof to the photovoltaic device allows increase of $J_{SC}$.

When the surface roughness Ra of the zinc oxide layer having the c axis slantindicular to the substrate is not more than 80 nm, the optical confinement effect is optimized in the long-wavelength region and the application thereof to the photovoltaic device allows increase of $J_{SC}$.

When the total reflectance at 800 nm is not less than 60%, the light around 800 nm can be reflected efficiently and it can contribute to increase of $J_{SC}$ in the application thereof to the photovoltaic device.

When the scattering reflectance at 800 nm is not less than 20%, the light around 800 nm can be confined efficiently and it can increase $J_{SC}$ in the application thereof to the photovoltaic device.

When the thickness of the metal aluminum layer is 1000 Å to 2500 Å, the aluminum layer can assure sufficient optical reflectance and facilitate optimization of the ZnO layer formed thereon.

When the thickness of the zinc oxide layer having the c axis perpendicular to the substrate is 1500 Å to 2500 Å, such a layer facilitates optimization of the zinc oxide layer having the c axis slantindicular to the substrate provided thereon, it can prevent the aluminum oxide layer or the metal aluminum layer from being dissolved during the electrodeposition so as to touch the electrodeposition bath, it can prevent occurrence of cracks or delamination during the electrodeposition, and it can enhance the reliability and environmental stability of the photovoltaic device with increased efficiency.

When the long SUS roll having the 2D-surface is used as a substrate, stable film formation can be carried out with little elution from the substrate and with little hindrance of impurities.

When the electric resistance in the direction normal to the substrate is not more than 20 Ω per $cm^2$, the application of the reflecting layer to the photovoltaic device allows the characteristics thereof to be readily optimized.

The method for forming the zinc oxide layer of the present invention can form the zinc oxide layer suitable for the reflecting layer on the stable basis and at low cost and, in turn, can provide the photovoltaic device with high efficiency on the stable basis and at low cost.

When the thickness of the zinc oxide layer by the electrodeposition method is not less than 5000 Å the sufficient scattering effect and optical confinement effect can be achieved.

When the zinc oxide layer by the electrodeposition method is deposited by electrodeposition from the solution of zinc nitrate having the concentration of not less than 0.15 mol/l, the projections and depressions with the excellent scattering effect can be effectively formed in the surface.

When the SUS sheet rolled in the long roll shape is used as a substrate, the layer by the sputtering method and the layer by the electrodeposition can be continuously formed in good order and on the stable basis, thereby improving the durability and throughput of the product.

When the substrate temperature is controlled during the formation of the zinc oxide layer by the sputtering method, the point to optimize optical confinement can be determined readily and it can provide the optimum reflecting layer for formation of the solar cell with optimum $J_{SC}$.

When oxidation is effected by using oxygen plasma, the thin film of aluminum oxide can be made in the same apparatus as the metal aluminum layer and the zinc oxide layer by sputtering; therefore, the increase of cost can be minimized and the reflectance of the reflecting layer obtained can be increased by formation of the thin film of aluminum oxide.

When the average grain size of crystal grains forming the zinc oxide layer having the c axis slantindicular to the substrate is 0.4 to 1.2 μm, the optical confinement effect can be expected when used as a reflecting layer for many photovoltaic devices.

What is claimed is:

1. A method for forming a zinc oxide layer comprising forming the zinc oxide layer on a substrate by electrodeposition in an aqueous solution containing phthalic acid.

2. A method for producing a photovoltaic device comprising:
    producing a substrate with a zinc oxide layer by forming the zinc oxide layer on a support substrate by electrodeposition in an aqueous solution containing phthalic acid; and
    forming a semiconductor layer on the substrate with the zinc oxide layer.

3. A method for forming a zinc oxide layer comprising:
    forming on a substrate a first zinc oxide layer having the c axis perpendicular to the substrate by a sputtering method; and forming a second zinc oxide layer having the c axis slantidicular to the substrate on the first zinc oxide layer by an electrodeposition method using an aqueous solution containing phthalic acid.

4. A method for producing a photovoltaic device comprising:

producing a substrate with a zinc oxide layer by forming on a support substrate a first zinc oxide layer having the c axis perpendicular to the support substrate by a sputtering method and forming a second zinc oxide layer having the c axis slantidicular to the support substrate on the first zinc oxide layer by an electrodeposition method using a solution containing phthalic acid; and forming a semiconductor layer on the substrate with the zinc oxide layer.

* * * * *

UNITED STATES PATENT AND TRADEMARK OFFICE
CERTIFICATE OF CORRECTION

PATENT NO. : 6,383,359 B2
DATED : May 7, 2002
INVENTOR(S) : Kozo Arao et al.

It is certified that error appears in the above-identified patent and that said Letters Patent is hereby corrected as shown below:

<u>Title page,</u>
Item [56], FOREIGN PATENT DOCUMENTS,
"0794270" should read -- 0 794 270 --; and
"EP 0 794 270 * 9/1997" should be deleted.

<u>Column 1,</u>
Line 37, "issues. The" should read -- issues. ¶ The --;
Line 48, "boehmitemodified" should read -- boehmite-modified --; and
Line 64, "substrate. The" should read -- substrate. ¶ The --.

<u>Column 2,</u>
Line 3, "substate," should read -- substrate, and --.
Line 61, "less. The" should read -- less. ¶ The --.

<u>Column 3,</u>
Line 12, "800 mn" should read -- 800 nm --.

<u>Column 4,</u>
Line 17, "are," should read -- are --; and
Line 58, "Å" should read -- Å, --.

<u>Column 5,</u>
Line 5, "JS," should read -- $J_{SC}$ --;
Line 13, "$J_{SC}$," should read -- $J_{SC}$ --.
Line 49, "substrate." should read -- substrate. Therefore, --; and
Line 50, "¶ Therefore," should be deleted.

<u>Column 6,</u>
Line 19, "due the" should read -- due to the --.

<u>Column 7,</u>
Line 52, "μm." should read -- nm. --.

<u>Column 8,</u>
Line 7, "is," should read -- $J_{SC}$ --.

UNITED STATES PATENT AND TRADEMARK OFFICE
CERTIFICATE OF CORRECTION

PATENT NO. : 6,383,359 B2
DATED : May 7, 2002
INVENTOR(S) : Kozo Arao et al.

It is certified that error appears in the above-identified patent and that said Letters Patent is hereby corrected as shown below:

Column 9,
Line 51, "roller" should read -- roller 2005 --; and
Line 52, "¶ 2005" should be deleted.

Column 10,
Line 57, "not illustrated." should read -- (not illustrated). --.

Column 11,
Line 11, "system," should read -- system --;
Line 23, "a washing" should read -- washing --;
Line 24, "a water" should read -- water --; and
Line 62, "¶ Overflowing" should read -- Overflowing --.

Column 12,
Line 10, "of" should be deleted; and
Line 46, "host" should read -- cost --.

Column 13,
Line 28, "not illustrated" should read -- (not illustrated) --; and
Line 59, "of" should read -- from --.

Column 14,
Line 9, "from" should read -- of --.

Column 15,
Line 27, "1000 A" should read -- 1000 Å --; and
Line 50, "flhn-forning" should read -- film-forming --.

Column 16,
Line 7, "a-Site" should read -- a-SiGe --; and
Line 65, "process. Namely," should read -- process. ¶ Namely, --.

Column 17,
Line 60, "purposed" should read -- proposed --.

UNITED STATES PATENT AND TRADEMARK OFFICE
CERTIFICATE OF CORRECTION

PATENT NO.     : 6,383,359 B2
DATED          : May 7, 2002
INVENTOR(S)    : Kozo Arao et al.

It is certified that error appears in the above-identified patent and that said Letters Patent is hereby corrected as shown below:

Column 18,
Line 13, "after kept" should read -- after being kept --;
Line 36, "ence." should read -- ence. The --; and
Line 37, "¶ The" should be deleted.

Column 19,
Line 22, "grow" should read -- grows --;
Line 42, "cmZ" should read -- $cm^2$ --; and
Line 64, "20 n per cmz" should read -- 20 $\Omega$ per $cm^2$ --.

Column 20,
Line 34, "a-Site" should read -- a-SiGe --;
Lines 39 and 59, "thickwise" should read -- thick-wise --; and
Line 67, "1.2 mA/cmZ" should read -- 1.2 mA/$cm^2$ --.

Column 21,
Line 54, "a-Site" should read -- a-SiGe --.

Column 23,
Line 1, "to," should read -- to --.

Signed and Sealed this

Eighth Day of October, 2002

Attest:

JAMES E. ROGAN
*Attesting Officer*        *Director of the United States Patent and Trademark Office*